(12) United States Patent
Yoshikawa et al.

(10) Patent No.: US 9,834,858 B2
(45) Date of Patent: Dec. 5, 2017

(54) PR-CONTAINING SCINTILLATOR SINGLE CRYSTAL, METHOD OF MANUFACTURING THE SAME, RADIATION DETECTOR, AND INSPECTION APPARATUS

(75) Inventors: Akira Yoshikawa, Miyagi (JP); Hiraku Ogino, Miyagi (JP); Kei Kamada, Miyagi (JP); Kenji Aoki, Miyagi (JP); Tsuguo Fukuda, Miyagi (JP)

(73) Assignees: TOHOKU TECHNO ARCH CO., LTD., Miyagi (JP); FURUKAWA CO., LTD., Tokyo (JP)

( * ) Notice: Subject to any disclaimer, the term of this patent is extended or adjusted under 35 U.S.C. 154(b) by 1330 days.

(21) Appl. No.: 11/718,776

(22) PCT Filed: Nov. 7, 2005

(86) PCT No.: PCT/JP2005/020386
§ 371 (c)(1),
(2), (4) Date: Apr. 29, 2008

(87) PCT Pub. No.: WO2006/049284
PCT Pub. Date: May 11, 2006

(65) Prior Publication Data
US 2008/0213151 A1  Sep. 4, 2008

(30) Foreign Application Priority Data

Nov. 8, 2004 (JP) ................................. 2004-324353
Feb. 1, 2005 (JP) ................................. 2005-025616

(51) Int. Cl.
*C01F 17/00* (2006.01)
*C30B 15/00* (2006.01)
(Continued)

(52) U.S. Cl.
CPC .......... *C30B 15/08* (2013.01); *C09K 11/7774* (2013.01); *C30B 29/22* (2013.01);
(Continued)

(58) Field of Classification Search
CPC ..... C09K 11/08; C09K 11/7774; C30B 29/22; C30B 29/24; C30B 29/28; G21K 4/00; G01T 1/1644; G01T 1/2985
(Continued)

(56) References Cited

U.S. PATENT DOCUMENTS 6,218,671 B1 *  4/2001  Gordon et al. ............... 250/397
6,246,744 B1 *  6/2001  Duclos et al. ................. 378/19
(Continued)

FOREIGN PATENT DOCUMENTS

EP  1754808  2/2007
JP  02-006590  1/1990
(Continued)

OTHER PUBLICATIONS

Wisniewski (Luminescence and Scintillation properties of YAG:Pr, IEEE Nuclear Science Symposium Conference Record, San Diego, CA, United States, Nov. 4-10, 2001 (2002),vol. 1, p. 341-345).*
(Continued)

*Primary Examiner* — Jun Li
(74) *Attorney, Agent, or Firm* — Rankin, Hill & Clark LLP

(57) ABSTRACT

The present invention provides an oxide-base scintillator single crystal having an extremely large energy of light emission, adoptable to X-ray CT and radioactive ray transmission inspection apparatus, and more specifically to provide a Pr-containing, garnet-type oxide single crystal, a Pr-containing perovskite-type oxide single crystal, and a Pr-containing silicate oxide single crystal allowing detection therefrom light emission supposedly ascribable to 5d-4f transition of Pr.

12 Claims, 29 Drawing Sheets

(51) Int. Cl.

| | |
|---|---|
| C30B 15/08 | (2006.01) |
| C09K 11/77 | (2006.01) |
| C30B 29/22 | (2006.01) |
| C30B 29/28 | (2006.01) |
| C30B 29/34 | (2006.01) |
| G01T 1/164 | (2006.01) |
| G01T 1/29 | (2006.01) |
| G21K 4/00 | (2006.01) |

(52) U.S. Cl.
CPC ............. *C30B 29/28* (2013.01); *C30B 29/34* (2013.01); *G01T 1/1644* (2013.01); *G01T 1/2985* (2013.01); *G21K 4/00* (2013.01)

(58) Field of Classification Search
USPC .................. 250/301.4 R; 252/361 R, 301.4 H
See application file for complete search history.

(56) References Cited

U.S. PATENT DOCUMENTS

| | | | |
|---|---|---|---|
| 6,278,832 | B1 | 8/2001 | Zagumennyi et al. |
| 2004/0084655 | A1 | 5/2004 | Vartuli et al. |
| 2004/0200964 | A1 | 10/2004 | Lefaucheur et al. |

FOREIGN PATENT DOCUMENTS

| | | |
|---|---|---|
| JP | 06-100360 | 4/1994 |
| JP | 2001-072968 | 3/2001 |
| RU | 2157552 C2 | 10/2000 |

OTHER PUBLICATIONS

International Search Report for PCT/JP2005/020386 dated Feb. 7, 2006.

European Search Report for PCT/JP2005020386 dated Mar. 25, 2010.

Van Eijk, et al.; Nd3+ and Pr3+ Doped Inorganic Scintillators, Record of the Nuclear Science Symposium and Medical Imaging Conference, New York, IEEE, US, vol. 1, Oct. 30, 1993, pp. 664-667.

M. Wisniewska et al., Luminescence and scintillation properties of YAG: Pr, IEEE Transactions on Nuclear Science, Jun. 2002; vol. 49, No. 3, pp. 926-930.

Japanese Office action dated Jan. 17, 2012.

Naud, J.D. et al. "The role of cerium sites in the scintillation mechanism of LSO," IEEE Trransactionf on Nuclear Science, vol. 43, No. 3, Jun. 1996.

Chani, V. I. "Growth of Y3A15O12:Nd fiber crystals by micro-pulling-down technique," Journal of Crystal Growth, 204, pp. 155-162, 1999.

Saoudi, A. et al. "A novel APD-based detector module for multi-modality PET/SPECT/CT scanners," IEEE Transactions on Nuclear Science, vol. 46, No. 3, pp. 479-484, Jun. 1999.

Moses, W. W. et al. "Prospects of time-of-flight PET using LSO scintillator," IEEE Transactions on Nuclear Science, vol. 46, No. 3, pp. 474-478, Jun. 1999.

Saoudi, A. et al. "Investigation of depth-of-interaction by pulse shape discrimination in multicrystal detectors read out by avalanche photodiodes," IEEE Transactions on Nuclear Science, vol. 46, No. 3, pp. 462-467, Jun. 1999.

Robbins, D. J. et al. "The relationship between concentration and efficiency in rare earth activated phosphors," J. Eelctrochem. Soc. 1979, 126(9), pp. 1556-1563.

Melcher, C. L. "Cerium-doped lutetium oxyorthosilicate: a fast, efficient new scintillator," Nuclear Science Syposium and Medical Imaging Conference, 1991, Conference Record of the 1991 IEEE., pp. 228-231.

Extended European Search Report dated Sep. 24, 2013 filed in corresponding European application No. 05800432.6.

Chinese Office Action dated Oct. 31, 2014 issued in the corresponding Chinese patent application No. 201210270265.4.

A.A. Fyodorov et al., "YAlO3:RE3+ Scintillators: Application for Ionizing Radiation Detection," IEEE conference Record Nuclear Science Symposium and Medical Imaging Conference, 1993, pp. 668-671.

\* cited by examiner

Photoluminescence decay of YAG:Pr (0.2%)
exc=280nm; em=310nm

Photoluminescence decay of LuAG:Pr (0.2%)
exc=280nm; em=310nm

Photoluminescence decay of YSO:Pr (0.2%)
exc=250nm; em=280nm

PR-CONTAINING SCINTILLATOR SINGLE CRYSTAL, METHOD OF MANUFACTURING THE SAME, RADIATION DETECTOR, AND INSPECTION APPARATUS

TECHNICAL FIELD

The present invention relates to a praseodymium (Pr)-containing scintillator single crystal, a method of manufacturing the same, and a radiation detector and an inspection apparatus using the scintillator single crystal.

BACKGROUND ART

In positron emission tomography (PET) apparatus, scintillation detectors characterized by high sensitivity and rapid response have been adopted, by virtue of their ability of coincidence counting of gamma ray (annihilated gamma ray: 511 KeV) of relatively large energies. Detector characteristics required herein include high time resolution for ensuring high counting rate and removal of random noise, and also include excellent energy resolution for ensuring removal of scattered ray from inside the body.

Therefore, demands for a scintillator suitable for the detectors satisfying these requirements include high density and high atomic number (largeness in photoelectric absorption ratio) in view of detection efficiency, high level of emission energy in view of needs for rapid response and high energy resolution, and short fluorescence lifetime (fluorescence decay time). The recent systems have adopted dense arrangement of a large number of fine, thin and long scintillators, aiming at multi-layered configuration and higher resolution, so that also their handlability, workability and price have become important matters to be considered for their selection.

Tl:NaI had most generally been used for the scintillation detector by virtue of its large energy of emission and relatively low cost, but was not expectable for improvement in sensitivity of the detector due to its low density, inconvenient to handle due to its deliquescence, and has therefore been replaced with $Bi_4Ge_3O_{12}$ (BGO).

BGO is characterized by a wavelength of 490 nm, a refractive index of 2.15, and a density of 7.13 g/cm$^3$ twice as large as that of Tl:NaI, and consequently shows a large ray energy absorption coefficient. Unlike hygroscopicity of Tl:NaI, BGO has no hygroscopicity, and has an advantage of good workability. Disadvantages reside in that BGO has a fluorescence conversion efficiency of only as small as κ% of that of Tl:NaI, so that light output in response to gamma ray is smaller than that of Tl:NaI, and also in that BGO shows an energy resolution in response to 1-MeV gamma ray of 15%, in contrast to 7% shown by Tl:NaI. Still another disadvantage is that the fluorescence decay time is extremely as long as 300 nsec or around.

$Ce:Gd_2SiO_5$(Ce:GSO), developed in Japan, is slightly inferior to BGO in the detection sensitivity, but is understood as a well-balanced, high-performance scintillator characterized by its density (6.71 g/cm$^3$), energy of light emission (doubled value of BGO), response time (30 to 60 nsec) and radioactive ray resistance (>10$^5$ gray). However, problems reside in slightly slower rise-up time, positive-hysteresis to radioactive ray (property of increasing the energy of light by irradiation), and strong tendency of cleavage.

A scintillator crystal, supposedly as being the state of the art at present, is Ce-doped $Lu_2SiO_5$ (Ce:LSO), characterized by excellent scintillator characteristics including high density (approx. 7.39 g/cm$^3$), short lifetime (approx. 50 nsec), and large emission energy (three times or more of BGO). The LSO crystal can be manufactured by the Czochralski method, and therefore has a some-ten-billon dollar market mainly contributed by US companies such as CTI Molecular Imaging Inc. (CTI), Crystal Photonics Inc. (CPI) and so forth. On the other hand, problems reside in high costs for manufacturing and processing due to its melting point relatively as high as 2,150° C. and large anisotropy in the linear expansion coefficient, and in low yield. Growth of single crystal of high-melting-point oxide from its molten state is generally carried out using a metal called iridium (Ir) as a crucible material, wherein temperatures exceeding 2,000° C. are close to the softening point of Ir, so that a severe temperature control is necessary for manufacture of the LSO crystal. In addition, the lifetime of the Ir crucible is short, and huge costs for re-casting the crucible fall heavily on the manufacturers. Moreover, large output is necessary for the high-frequency oscillator in order to realize such high super-high temperature, and this also pushes up the running cost as a whole.

On the other hand, Ce:GSO and Ce:LSO, having been used as light emitting materials for scintillator, are large in the emission energy by virtue of a large amount of Ce, a light emitting element, contained therein, but the content exceeding several percents may result in distinct concentration quenching, and no more shows the scintillator effect.

In addition, Ce is, second to La, largest in the rare earth ions, and is significantly larger than representative rare earth ions (Y, Gd, Lu) in the host crystal, so that the effective segregation coefficient largely deflects from 1. This means that compositional fluctuation in the direction of growth is inevitable. This phenomenon is causative of varying physical properties such as emission energy and so forth, and raises a serious problem when adoption to a high-precision-type PET is aimed at.

In this situation, a current expectation is directed to development of a next-generation scintillator advantageous not only in the cost, but also in having a larger energy absorption coefficient, and higher energy resolution and time resolution, that is, capable of increasing the number of sampling in a unit time (Patent Document 1).

On the other hand, not only PET, but also X-ray CT holds a large importance in medical imaging apparatus. When taking the whole range of non-destructive inspection into consideration, also X-ray CT, and scintillator crystal for radioactive ray transmission inspection are of large importance. Scintillator crystals aimed at these purposes are desired to have large emission energy such as Tl:NaI and CsI, rather than to have short fluorescence lifetime such as Ce:GSO and Ce:LSO.

From these points of view, current demands are directed to develop a next-generation scintillator characterized by low cost, high energy absorption coefficient, and large emission energy.

[Patent Document 1] Japanese Laid-Open Patent Publication No. 2001-72968

DISCLOSURE OF THE INVENTION

The present invention was conceived to solve the above-described problems, wherein the objects thereof reside in achieving characteristics superior to those of BGO, characteristics equivalent or superior to those of GSO, including high density (6.71 Kg/cm$^3$ or above), large energy of emission not smaller than that of NaI (five times or more as large as BGO), short lifetime (60 nsec or shorter), high energy of emission (twice or more as large as BGO)), and low cost of manufacturing. It is another object to achieve such excellent scintillator material using an oxide material, which can more readily be grown as compared with GSO and LSO, or using a fluoride material having a lower melting point than that of the oxide material.

Through extensive investigations aimed at solving the above-described subjects, the present inventors confirmed light emission supposedly ascribable to 5d-4f transition of Pr(III) in some Pr-containing single crystals.

These single crystals were found to achieve large absolute light yield ratio, large energy of light emission, and short fluorescence lifetime (decay time), and led the inventors to complete the present invention.

According to the present invention, there is provided a scintillator single crystal expressed by $(PrRE)_a M_b (O_p F_{1-p})_c$:

(where, RE represents any one species, or two or more species selected from Y, Sc, Yb, Lu, La and Ce;

M is any one or more species selected from Al, Ga, Si, Li, Na, K, Cs, Rb, Mg, Ca, Sr, Ba, Sc, Zr, and Hf; and $0<a<10$, $0<b<10$ and $0<c<50$, and p is 0 or 1.)

The scintillator single crystal may emit fluorescence having a wavelength of 200 to 350 nm when excited by gamma ray.

Because the scintillator single crystal of the present invention has a fluorescence decay time of 300 nsec or shorter (having an emission peak at around 300 nm), only a short sampling time for fluorescence measurement will suffice, and consequently large time resolution, or reduction in the sampling intervals, can be expected. Realization of large time resolution can increase the number of sampling in a unit time.

The scintillator single crystal having such short lifetime is largely expected as a scintillator adoptable to rapid-response detection of radioactive ray in PET and SPECT.

According to the present invention, the oxide-base scintillator crystals having characteristics superior to those of BGO, and equivalent or superior to those of GSO, were found out. It was also found that these crystals have characteristics superior to those of NaI. These crystals have smaller anisotropy in the linear expansion coefficient as compared with GSO and LSO, and can readily be grown up to single crystals.

According to the present invention, also fluoride-base scintillator crystals, having characteristics superior to those of BGO, and equivalent or superior to those of GSO, were found out. They are expected to decrease consumption of electric power and cooling water in manufacture of the crystals, by virtue of their low melting points (approx. 1,350° C.). They allow adoption of Pt and Ir as materials of the crucible, but also allows adoption of a less-expensive carbon crucible, and this contributes to reduction in the production cost.

BRIEF DESCRIPTION OF THE DRAWINGS

The above and other objects, advantages and features of the present invention will be more apparent from the preferable embodiments described below, and the accompanying drawings.

BEST MODES FOR CARRYING OUT THE INVENTION

Figure 1:
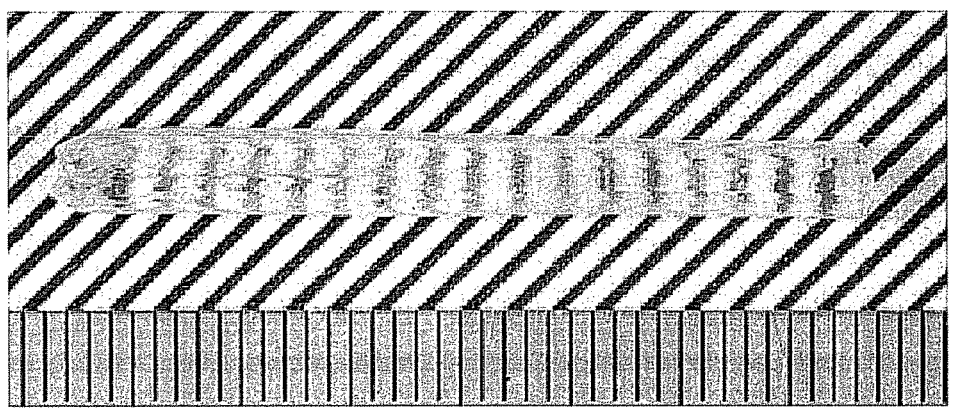
FIG. 1 is a drawing showing $(Pr_{0.001}Y_{0.999})_3Al_5O_{12}$ single crystal (Pr0.1%:YAG) of an embodiment of the present invention.

Embodiments of the present invention will be explained below.

A scintillator single crystal according to the embodiments of the present invention is a scintillator single crystal expressed by general formula $(PrRE)_aM_b(O_pF_{1-p})_c$: (where, RE is any one of, or two or more species selected from Y, Sc, Yb, Lu, La and Ce, M is any one species, or more species selected from Al, Ga, Si, Li, Na, K, Cs, Rb, Mg, Ca, Sr, Ba, Sc, Zr, Hf, Mn, Fe, Co, Ni, Cu, Zn, Pd, Cd and Pb, wherein 0<a<10, 0<b<10 and 0<c<50, and p is 0 or 1.)

This embodiment is supposed to make use of light emission ascribable to 5d-4f transition of Pr by contribution of Pr-containing scintillator single crystal, and makes it possible to largely improve the absolute light yield ratio above from 8,200 photons/MeV of BGO.

The scintillator single crystal, capable of emitting fluorescence at 200 to 350 nm, more preferably 200 to 310 nm, when excited by gamma ray, can preferably be used for the purpose of rapid-response radioactive detection.

This sort of scintillator single crystal can be exemplified by oxide-base single crystal and fluoride-base single crystal.

The oxide-base scintillator single crystal of this embodiment is characterized by p=1 in the scintillator single crystal expressed by the above-described general formula, wherein RE is any one species, or two or more species selected from Y, La, Sc, Yb and Lu, M is at least one species selected from Al and Ga, and (a,b,c) is any one of (3,5,12), (1,1,3) and (2,1,5).

A first embodiment of this sort of oxide-base scintillator single crystal relates to a scintillator single crystal composed of a garnet-type oxide expressed by $(Pr_xRE_{1-x})_3(Al_{1-y}Ga_y)_5O_{12}$, where RE is any one of, or two or more species selected from Y, Sc, Yb and Lu, Pr concentration x falls in the range of 0.0001≤x<0.02, preferably 0.001≤x≤0.02, more preferably 0.002≤x≤0.02, and still more preferably 0.002≤x≤0.003. Ga concentration y falls in the range of 0≤y≤1, preferably 0≤y≤0.25 or 0.75≤y≤1, and more preferably y=0 or 1.

This sort of scintillator single crystal composed of a garnet-type oxide is specifically exemplified by a scintillator single crystal composed of a garnet-type oxide expressed by $(Pr_xY_{1-x})_3Al_5O_{12}$ or $(Pr_xLu_{1-x})_3Al_5O_{12}$ (where, Pr concentration x falls in the range described in the above), scintillator single crystal composed of a garnet-type oxide expressed by $(Pr_xRE_{1-x})_3Ga_5O_{12}$ (where, RE is any one species, or two or more species selected from Y, Sc, Yb and Lu, Pr concentration x falls in the range described in the above), and so forth.

A second embodiment of this sort of oxide-base scintillator single crystal relates to a scintillator single crystal composed of a perovskite-type oxide expressed by $(Pr_xRE_{1-x})AlO_3$, where, RE is any one of, or two or more species selected from Y, La, Yb and Lu, Pr concentration x falls in the range of 0.0001≤x<0.3, preferably 0.001≤x<0.05, and more preferably 0.002≤x≤0.02.

This sort of scintillator single crystal composed of a perovskite-type oxide is specifically exemplified by a scintillator single crystal composed of a perovskite-type oxide expressed by $(Pr_xY_{1-x})AlO_3$, $(Pr_xLa_{1-x})AlO_3$ or $(Pr_xLu_{1-x})AlO_3$ (where, Pr concentration x falls in the range described in the above).

Although not covered by the above-described general formula of the scintillator single crystal composed of a perovskite-type oxide, also those having Lu replaced at the site of Al are adoptable, examples of which include $(Pr_xLa_{1-x})LuO_3$.

A third embodiment of this sort of oxide-base scintillator single crystal relates to a scintillator single crystal composed of a silicate oxide expressed by $(Pr_xRE_{1-x})_2SiO_5$, where, RE is any one of, or two or more species selected from Y, La, Yb and Lu, Pr concentration x falls in the range of $0.0001 \le x < 0.3$, preferably $0.001 \le x < 0.05$, and more preferably $0.002 \le x \le 0.02$.

This sort of scintillator single crystal composed of a perovskite-type oxide is specifically exemplified by a scintillator single crystal composed of a silicate oxide expressed by $(Pr_xY_{1-x})_2SiO_5$ or $(Pr_xLu_{1-x})_2SiO_5$ (where, Pr concentration x falls in the range described in the above).

The scintillator single crystal of this embodiment composed of other oxide is characterized by p=1 in the scintillator single crystal expressed by the above-described general formula, wherein RE is any one species, or two or more species selected from Y, Sc, Yb and Lu, M is at least one species selected from Al, Ga, Mg, Ca, Sr, Sc, Zr and Hf, and (a,b,c) is (3,5,12).

The scintillator single crystal composed of this sort of oxide is specifically exemplified by a scintillator single crystal composed of a garnet-type oxide expressed by $(Pr_xY_{1-x})_3(Al_{1-y}Sc_y)_5O_{12}$ or $(Pr_xLu_{1-x})_3(Al_{1-y}Sc_y)_5O_{12}$, where, Pr concentration x falls in the range of $0.0001 \le x < 0.3$, preferably $0.001 \le x < 0.05$, more preferably $0.002 \le x \le 0.02$, Sc concentration y falls in the range of $0 \le y \le 0.4$, more preferably $0 \le y 0.01$.

In addition, also a scintillator single crystal expressed by $(Pr_xRE_{1-x})_3(M^1{}_yM^2{}_{1-2y}M^3{}_y)_5O_{12}$ can preferably be used, where, RE is any one species, or two or more species selected from Y, Sc, Yb and Lu, $M^1$ is any one species, or two or more species selected from Mg, Ca and Sr, $M^2$ is any one species, or two or more species selected from Al, Ga and SC, $M^3$ is one species or two or more species selected from Zr and Hf, Pr concentration x falls in the range of $0.0001 \le x < 0.3$, preferably $0.001 \le x < 0.05$, more preferably $0.002 \le x \le 0.02$, and concentration y falls in the range of $0 \le y \le 0.5$, and more preferably $0 \le y \le 0.1$.

As the oxide-base scintillator single crystals, the scintillator single crystals of rare earth oxides described below are also adoptable.

As this sort of scintillator single crystal composed of a rare earth oxide, a scintillator single crystal composed of a rare earth oxide expressed by $(Pr_xRE_{1-x})_2O_3$ is adoptable, where RE is anyone species, or two or more species selected from Y, Sc, La, Yb and Lu, and Pr concentration x falls in the range of $0.0001 \le x < 0.3$, preferably $0.001 \le x < 0.05$, and still more preferably $0.002 \le x \le 0.02$.

This sort of scintillator single crystal composed of a rare earth oxide is specifically exemplified by a scintillator single crystal composed of a rare earth oxide expressed by $(Pr_xY_{1-x})_2O_3$, $(Pr_xSc_{1-x})_2O_3$, $(Pr_xLa_{1-x})_2O_3$ or $(Pr_xLu_{1-x})_2O_3$ (where Pr concentration x falls in the range described in the above).

As the scintillator single crystal composed of still another rare earth oxide, a scintillator single crystal composed of a rare earth oxide expressed by $Pr_xRE_{1-x}VO_4$ is adoptable, where, RE is any one species, or two or more species selected from Y, Sc, Yb and Lu, and Pr concentration x falls in the range of $0.0001 \le x < 0.3$, preferably $0.001 \le x < 0.05$, and more preferably $0.002 \le x \le 0.02$.

As the scintillator single crystal composed of still another rare earth oxide, a scintillator single crystal composed of a rare earth oxide expressed by $(Pr_xRE_{1-x})RE'O_3$ is adoptable, where, RE and RE', differing from each other, are any one species, or two or more species selected from La, Gd, Y, Sc, Yb and Lu, and Pr concentration x falls in the range of $0.0001 \le x < 0.3$, preferably $0.001 \le x < 0.05$, and more preferably $0.002 \le x \le 0.02$.

As the scintillator single crystal composed of still another rare earth oxide, a scintillator single crystal composed of a rare earth oxide expressed by $(Pr_xRE_{1-x})_2Si_2O_7$ is adoptable, where, RE is any one species, or two or more species selected from Y, Sc, Yb and Lu, and Pr concentration x falls in the range of $0.0001 \le x < 0.3$, more preferably $0.001 \le x < 0.05$, and more preferably $0.002 \le x \le 0.02$.

The fluoride-base scintillator single crystal of this embodiment corresponds to the case of p=0 in the scintillator single crystal expressed by the above-described general formula. RE is any one species, or two or more species selected from La, Ce, Yb, Lu and Y, and among others, Y, Yb or Lu is particularly preferable. M is any one species or more selected from Li, Na, K, Cs, Rb, Mg, Ca, Sr, Ba, Al, Mn, Fe, Co, Ni, Cu, Zn, Pd, Cd, Pb, Zr and Hf.

A first embodiment of such fluoride-base scintillator single crystal relates to a scintillator single crystal expressed by $Pr_wM_xRE_yF_z$, where, RE is any one of, or two or more species selected from La, Ce, Yb, Lu and Y, and M is any one or more species selected from Li, Na, K, Cs, Rb, Mg, Ca, Sr, Ba and Al. w, x and z respectively satisfy $0.0001 \le w < 0.3$, $0 < x < 10$, $0 < y < 10$ and $0 < z < 50$.

This sort of fluoride-base scintillator single crystal can be exemplified by those having K (potassium atom) as M in the above-described general formula fluoride-base scintillator single crystal, and more specifically by a scintillator single crystal expressed by $K(RE_{1-w}Pr_w)_3F_{10}$ (where, RE is any one species, or two or more solid solutions selected from La, Ce, Yb, Lu and Y, and $0.0001 \le w < 0.3$.)

The fluoride-base scintillator single crystal can specifically be exemplified by a scintillator single crystal expressed by $Ba_x(RE_{1-w}Pr_w)F_z$ (where, RE is any one species, or two or more solid solutions selected from La, Ce, Yb, Lu and Y, and $0.0001 \le w < 0.3$.)

For these fluoride-base scintillator single crystals, those having Y, or a solid solution of Y and Lu as RE are preferable.

As another fluoride-base scintillator single crystal, a scintillator single crystal expressed by $Pr_wM_xF_z$ can specifically be exemplified (where, M is any one species, or more species selected from Li, Na, K, Cs, Rb, Mg, Ca, Sr, Ba and Al, and $0.0001 \le w < 0.3$, $0 < x < 10$, $0 < z < 50$.)

Of the above-described fluoride-base scintillator single crystals of this embodiment expressed by $Pr_wM_xRE_yF_z$ or $Pr_wM_xF_z$, particularly preferable examples include $(Pr_w(Lu, Y)_{1-w})KF_{10}$, $(Pr_w(Gd,Y)_{1-w})KF_{10}$, $(Pr_wRE_{1-w})Ba_xF_z$, $(Pr_wYb_{2-w})BaF_8$ or $Ba_2(Pr_wYb_{1-w})F_7$, and specific examples thereof include the followings.

$K(Y_{0.99}Pr_{0.01})_3F_{10}$, $K(Y_{0.59}Yb_{0.4}Pr_{0.01})_3F_{10}$, $K(Y_{0.59}Gd_{0.4}Pr_{0.01})_3F_{10}$, $K(Y_{0.59}Lu_{0.4}Pr_{0.01})_3F_{10}$, $Ba(Y_{0.97}Pr_{0.03})_2F_8$, $Cs_3(Y_{0.99}Pr_{0.01})F_6)$ $Ba(Lu_{0.999}Pr_{0.001})F_8$, $Li(Lu_{0.95}Pr_{0.05})F_4$, $K(Y_{0.89}Ce_{0.10}Pr_{0.01})_3F_{10}$, $K(Y_{0.89}La_{0.10}Pr_{0.01})_3F_{10}$, $(Y_{0.89}Gd_{0.10}Pr_{0.01})_3F_{10}$, $Pr_{0.01}Mg_{0.99}F_{2.01}$, $Pr_{0.03}Ca_{0.97}F_{2.03}$, $Pr_{0.05}Sr_{0.95}F_{2.05}$, $Pr_{0.001}Ba_{0.999}F_{2.001}$, $Pr_{0.01}Mn_{0.99}F_{2.01}$, $Pr_{0.001}LiCaAlF_6$, $Pr_{0.001}LiSrAlF_6$, $Pr_{0.001}NaCaAlF_6$, $Pr_{0.001}BaMgF_4$, $Ba_2(Pr_{0.01}La_{0.99})F_7$, $Ba_2(Pr_{0.01}Ce_{0.99})F_7$, $Ba_2(Pr_{0.01}Gd_{0.99})F_7$, $Ba_2(Pr_{0.01}Yb_{0.99})F_7$, $Ba_2(Pr_{0.01}Lu_{0.99})F_7$, $Ba_2(Pr_{0.01}Y_{0.99})F_7$, $Ba(Pr_{0.01}Yb_{1.99})F_8$, $KLu_3F_{10}$, etc.

With respect to the composition of the fluoride-base scintillator single crystals of this embodiment expressed by $Pr_wM_xRE_yF_z$ or $Pr_wM_xF_z$, an absolute light yield ratio (photons/MeV) of 1,000 to 200,000 (photons/MeV) or around is achievable, preferably 8,000 to 200,000 (photons/MeV), more preferably 80,000 to 200,000 (photons/MeV), and in particular 8,000 to 120,000 (photons/MeV) is preferable, 16,000 to 80,000 (photons/MeV) is more preferable, representing an extremely high energy of light emission of the fluoride-base scintillator crystal. More specifically, the absolute light yield ratio relative to that of BGO is expressed by a factor of 0.125 to 25, preferably 1 to 25, and more preferably 10 to 25. The ratio is preferably expressed by a factor of 1 to 15, and more preferably 2 to 10, in view of technical effect when correlation with elongation of the fluorescence lifetime due to energy transition is taken into consideration.

In the composition of the fluoride-base scintillator single crystal expressed by $Pr_wM_xRE_yF_z$ or $Pr_wM_xF_z$, Pr concentration w falls in the range of $0.0001 \leq w < 0.3000$, preferably $0.0010 \leq w < 0.0500$, and more preferably $0.0020 \leq w \leq 0.0200$. Because x, y and z are arbitrarily determined depending on the crystal composition, and are therefore not specifically limited, wherein they are preferably $0 < x < 10.0000$ and more preferably $0 < x < 4.0000$, $0 < y < 10.0000$ and more preferably $0 < y < 4.0000$, and $0 < z < 50.0000$ and more preferably $0 < z < 20.0000$. More specifically, for the case where M is K, x=1, y=3 and z=10 preferably, that is, $K(Pr_wRE_{1-w})_3F_{10}$ is preferable. Also in this case, Pr concentration w falls in the range of $0.0001 \leq w < 0.3000$, preferably $0.0001 \leq w < 0.0500$, and more preferably $0.0020 \leq w \leq 0.0200$, wherein RE is one species or two or more rare earth elements selected from La, Ce, Gd, Lu, Y and Yb, and among others, Y, Gd, Yb or Lu is particularly preferable.

For the case where M is Ba, x=2, y=1 and z=7 preferably, or x=1, y=2 and z=8 preferably, that is, $Ba_2(Pr_wRE_{1-w})F_7$ or $Ba(Pr_wRE_{1-w})_2F_8$ is preferable. Also in this case, Pr concentration w falls in the range of $0.0001 \leq w < 0.3000$, preferably $0.0010 \leq w < 0.0500$, and more preferably $0.0020 \leq w \leq 0.0200$, wherein RE is one species, or two or more species of rare earth element selected from La, Ce, Gd, Lu, Y and Yb, and among others, Y, Gd, Yb or Lu is preferable.

Next, the method of manufacturing the oxide or fluoride-base scintillator single crystal according to the present invention will be explained.

The method of manufacturing according to this embodiment is characterized by charging Pr into a molten crystal having a composition expressed by $(PrRE)_aM_b(O_pF_{1-p})_c$, to an amount 5 to 15 times as much as a target Pr content, and allowing a single crystal to grow by the micro-pulling-down process using a molybdenum (Mo) crucible, or a iridium (Ir) crucible, or a crucible composed of an alloy of Ir and rhenium (Re).

In this case, RE is any one of, or two or more species selected from Y, Sc, Yb, Lu, La and Ce, M is any one species, or more species selected from Al, Ga, Si, Li, Na, K, Cs, Rb, Mg, Ca, Sr, Ba, Sc, Zr, Hf, Mn, Fe, Co, Ni, Cu, Zn, Pd, Cd and Pb, $0 < a < 10$, $0 < b < 10$ and $0 < c < 50$, and p is 0 or 1.

The method of manufacturing the scintillator single crystal is given herein as a method of manufacturing a scintillator single crystal composed of an oxide, when p=1 in the composition of the molten crystal expressed by the above-described general formula.

This sort of method of manufacturing can specifically be exemplified by a method of manufacturing a scintillator single crystal composed of a garnet-type oxide, wherein the molten crystal has a composition allowing a single crystal expressed by $(Pr_xRE_{1-x})_3(Al_{1-y}Ga_y)_5O_{12}$ to produce, and has a Pr concentration of 5x to 15x, where, RE is any one species, or two or more species selected from Y, Sc, Yb and Lu, and Pr concentration x falls in the range of $0.0001 \leq x < 0.02$, preferably $0.001 \leq x \leq 0.02$, more preferably $0.002 \leq x \leq 0.02$, and still more preferably $0.002 \leq x \leq 0.003$. Ga concentration y falls in the range of $0 \leq y \leq 1$, preferably $0 \leq y \leq 0.25$ or $0.75 \leq y \leq 1$, and more preferably y=0 or 1.

In this sort of method of manufacturing a scintillator single crystal composed of a garnet-type oxide, the molten crystal preferably has a composition allowing a single crystal expressed by $(Pr_xY_{1-x})_3Al_5O_{12}$, $(Pr_xLu_{1-x})_3Al_5O_{12}$, or $(Pr_xRE_{1-x})_3Ga_5O_{12}$ to be obtained, and has a Pr concentration of 5x to 15x, where, RE is any one of, or two or more species selected from Y, Sc, Yb and Lu. Pr concentration x falls in the range described in the above.

This sort of method of manufacturing can specifically be exemplified by a method of manufacturing a scintillator single crystal composed of a perovskite-type oxide, wherein the molten crystal has a composition allowing a single crystal expressed by $(Pr_xRE_{1-x})AlO_3$ to produce, and has a Pr concentration of 5x to 15x.

In this case, RE is any one of, or two or more species selected from Y, La, Yb and Lu, and Pr concentration x falls in the range of $0.0001 \leq x < 0.3$, preferably $0.001 \leq x < 0.05$, and more preferably $0.002 \leq x \leq 0.02$.

In this sort of method of manufacturing a scintillator single crystal composed of a perovskite-type oxide, the molten crystal preferably has a composition allowing a single crystal expressed by $(Pr_xY_{1-x})AlO_3$, $(Pr_xLa_{1-x})AlO_3$ or $(Pr_xLu_{1-x})AlO_3$ to produce, and has a Pr concentration of 5x to 15x. Pr concentration x falls in the range described in the above.

This sort of method of manufacturing can specifically be exemplified by a method of manufacturing a scintillator single crystal composed of a silicate oxide, wherein the molten crystal has a composition allowing a single crystal expressed by $(Pr_xRE_{1-x})_2SiO_5$ to produce, and has a Pr concentration of 5x to 15x.

In this case, RE is any one of, or two or more species selected from Y, La, Yb and Lu. Pr concentration x falls in the range of $0.0001 \leq x < 0.3$, preferably $0.001 \leq x < 0.05$, and more preferably $0.002 \leq x \leq 0.02$.

In this sort of method of manufacturing a scintillator single crystal composed of a silicate oxide, the molten crystal preferably has a composition allowing a single crystal expressed by $(Pr_xY_{1-x})_2SiO_5$ or $(Pr_xLu_{1-x})_2SiO_5$ to produce, and has a Pr concentration of 5x to 15x. Pr concentration x falls in the range described in the above.

This embodiment also relates to a method of manufacturing a scintillator single crystal composed of a rare earth oxide, characterized by growing the single crystal from a molten crystal having a composition which allows a single crystal expressed by $(Pr_xRE_{1-x})_2O_3$ to produce, and having a Pr concentration of 5x to 15x, by the micro-pulling-down process using a Re crucible.

In this case, RE is any one species, or two or more species selected from Y, Sc, La, Yb and Lu, and Pr concentration x falls in the range of $0.0001 \leq x < 0.3$, preferably $0.001 \leq x < 0.05$, and more preferably $0.002 \leq x \leq 0.02$.

In this sort of method of manufacturing a scintillator single crystal composed of a rare earth oxide, the molten crystal may have a composition allowing a single crystal expressed by $(Pr_xY_{1-x})_2O_3$, $(Pr_xSc_{1-x})_2O_3$, $(Pr_xLa_{1-x})_2O_3$ or $(Pr_xLu_{1-x})_2O_3$ to produce, and a Pr concentration of 5x to 15x (where, Pr concentration x falls in the range described in the above).

The method of manufacturing a scintillator single crystal composed of an oxide of this embodiment also includes the followings.

(1) A method of manufacturing a scintillator single crystal composed of a garnet-type oxide, characterized by growing a single crystal from a molten crystal having a composition which allows a single crystal expressed by $(Pr_xY_{1-x})_3(Al_{1-y}Sc_y)_5O_{12}$ or $(Pr_xLu_{1-x})_3(Al_{1-y}Sc_y)_5O_{12}$ to produce, and having a Pr concentration of 5x to 15x, by the micro-pulling-down process using a Mo crucible, or an Ir crucible, or a crucible composed of an alloy of Ir and Re (where, Pr concentration x falls in the range of $0.0001 \leq x < 0.3$, and Sc concentration y falls in the range of $0 \leq y \leq 0.4$):

(2) A method of manufacturing a scintillator single crystal composed of a garnet-type oxide, characterized by growing a single crystal from a molten crystal having a composition which allows a single crystal expressed by $(Pr_xRE_{1-x})_3(M^1_yM^2_{1-2y}M^3_y)_5O_{12}$ to produce, and having a Pr concentration of 5x to 15x, by the micro-pulling-down process using a Mo crucible, or Ir crucible, or a crucible composed of an alloy of Ir and Re (where, RE is any one species, or two or more species selected from Y, Sc, Yb and Lu, $M^1$ is any one species, or two or more species selected from Mg, Ca and Sr, $M^2$ is any one species, or two or more species selected from Al, Ga and Sc, $M^3$ is one species, or two or more species of metal selected from Zr and Hf, Pr concentration x falls in the range of $0.0001 \leq x < 0.3$, and concentration y falls in the range of $0 \leq y < 0.5$):

(3) A method of manufacturing a scintillator single crystal composed of a rare earth oxide, characterized by growing a single crystal from a molten crystal having a composition which allows a single crystal expressed by $RePr_xRE_{1-x}VO_4$ to produce, and having a Pr concentration of 5x to 15x, by the micro-pulling-down process using a Mo crucible, or Ir crucible, or a crucible composed of an alloy of Ir and Re (where, RE is any one species, or two or more species selected from Y, Sc, Yb and Lu, and Pr concentration x falls in the range of $0.0001 \leq x < 0.3$):

(4) A method of manufacturing a scintillator single crystal composed of a rare earth oxide, characterized by growing a single crystal from a molten crystal having a composition which allows a single crystal expressed by $(Pr_xRE_{1-x})RE'O_3$ to produce, and having a Pr concentration of 5x to 15x, by the micro-pulling-down process using a Mo crucible, or Ir crucible, or a crucible composed of an alloy of Ir and Re (where, RE and RE', differing from each other, are any one species, or two or more species selected from La, Gd, Y, Sc, Yb and Lu, and Pr concentration x falls in the range of $0.0001 \leq x < 0.3$):

(5) A method of manufacturing a scintillator single crystal composed of a rare earth oxide, characterized by growing a single crystal from a molten crystal having a composition which allows a single crystal expressed by $(Pr_xRE_{1-x})_2Si_2O_7$ to produce, and having a Pr concentration of 5x to 15x, by the micro-pulling-down process using a Mo crucible, or Ir crucible, or a crucible composed of an alloy of Ir and Re (where, RE is any one species, or two or more species selected from Y, Sc, Yb and Lu, and Pr concentration x falls in the range of $0.0001 \leq x < 0.3$).

In the method of manufacturing all of these oxides, any general oxide materials can be used as the starting materials, but for the case where use as the scintillator single crystal is aimed at, use of high-purity source materials of 99.99% or above (4N or above) is particularly preferable, wherein these starting materials are weighed and mixed so as to attain a target composition when the molten crystal is formed. It is particularly preferable that these source materials are extremely low in the content of impurities other than target components (1 ppm or below, for example). It is particularly preferable to use source materials containing almost no elements (Tb, for example) showing light emission at around the emission wavelength.

Growth of the crystal is preferably allowed to proceed under an atmosphere of an inert gas (Ar, $N_2$, He, etc., for example). It is also allowable to use a mixed gas of an inert gas (Ar, $N_2$, He, etc., for example) and oxygen gas. It is to be noted that, for the case where the growth of the crystal is allowed to proceed using the mixed gas, partial pressure of oxygen is preferably adjusted to 2% or below, in view of preventing oxidation of the crucible. In the post-processes such as annealing after the crystal growth, oxygen gas, inert gas (Ar, $N_2$, He, etc., for example), and mixed gas of inert gas (Ar, $N_2$, He, etc., for example) and oxygen gas can be used. When the mixed gas is used, the partial pressure of oxygen is not limited to 2%, allowing adoption of any ratio of mixing ranging from 0% to 100%.

Besides the micro-pulling-down process, any of the Czochralski method (pulling-up process), the Bridgeman method, the zone melting process, or the edge-defined, film-fed growth process (EFG process) and so forth are adoptable without special limitation as the method of manufacturing the scintillator single crystal composed of the oxide according to this embodiment, wherein the Czochralski method or the Bridgeman method is preferable, in view of obtaining a large-sized single crystal for the purpose of improving the yield ratio and relatively reducing the process loss. On the other hand, so far as only a small-sized single crystal is used as the scintillator single crystal, the zone melting process, the EFG process, the micro-pulling-down process and the Czochralski method are preferable because there is no need, or only a small need of post-processing, wherein the micro-pulling-down process and the zone melting process are particularly preferable, for reasons of wettability with the crucible and so forth. The concentration of Pr in the molten crystal at the time of charging is adjusted to approximately 5 to 15 times as much as the target amount of incorporation, although being susceptible to change depending on the process of manufacturing to be adopted.

It is also allowable to compose the crucible and afterheater adopted herein using platinum, iridium, rhodium, rhenium, or alloys thereof.

Not only the high-frequency oscillator, but also a resistance heater is adoptable.

Paragraphs below will describe the method of manufacturing the scintillator single crystal composed of the oxide of this embodiment, referring to an exemplary case of adopting the method of manufacturing the single crystal based on the micro-pulling-down process, without being limited thereto.

The micro-pulling-down process is allowed to proceed using an atmosphere-adjustable, micro-pulling-down apparatus making use of high-frequency induction heating. The micro-pulling-down apparatus has a crucible, a seed holding jig holding a seed to be brought into contact with a molten crystal discharged from a fine orifice provided at the bottom of the crucible, a moving mechanism moving the seed holding jig downward, a moving speed control device for the moving mechanism, and an induction heating unit heating the crucible. The single crystal manufacturing apparatus is configured to manufacture a single crystal by forming the solid-liquid interface straight under the crucible, and by moving the seed crystal downward.

The crucible is made of carbon, platinum, iridium, rhodium, rhenium, or alloy thereof, and an after-heater, which is a heating element composed of carbon, platinum, iridium, rhodium, rhenium, or alloy thereof, is disposed at the outer circumference of the bottom of the crucible. The crucible and the after-heater are configured as being adjustable in the energy of heat generation through adjustment of the output of the induction heating unit, so as to control the temperature and distribution thereof of the solid-liquid interface area of the molten crystal drawn out from the fine orifice provided to the bottom of the crucible.

The apparatus is also configured as using SUS as a chamber material, using $SiO_2$ window component, providing a rotary pump so as to enable atmospheric control, so that a degree of vacuum of $1\times10^{-3}$ Torr or below can be achieved before the gas replacement. The chamber can be supplied with Ar, $N_2$, $H_2$, $O_2$ gas or the like, after being precisely controlled in the flow rate thereof using an attached gas flow meter.

Using this apparatus, the source material prepared according to the above-described method is placed in the crucible, the inner space of the furnace is evacuated to a high degree of vacuum, Ar gas or a mixed gas of Ar gas and $O_2$ gas is introduced into the furnace so as to adjust the inner space of the furnace to an inert gas atmosphere or an atmosphere with low partial pressure of oxygen, the crucible is heated by gradually applying high-frequency power to a high-frequency induction heating coil, to thereby completely melt the source material in the crucible.

Next, the crystal is grown according to the procedures below. The seed crystal is gradually elevated at a predetermined speed, the tip thereof is brought into contact with the orifice at the lower end of the crucible so as to thoroughly run it thereinto, and the crystal is grown by descending a pulling-down axis while controlling the temperature of the molten crystal. The seed crystal is preferably equivalent to a target substance to be grown up to a crystal, or such as having both of structure and composition close thereto, but is not limited thereto. The seed crystal used herein preferably has clearly defined orientation. The crystal growth comes to the end, when the entire portion of the available material crystallizes, leaving no residual molten crystal. On the other hand, a device for consecutive charging of the source material may be incorporated, for the purpose of keeping the composition uniform, and of producing a long crystal.

Paragraphs below will describe a method of manufacturing the scintillator single crystal composed of the oxide of this embodiment, also exemplifying an embodiment of using the pulling-up process, without limiting the embodiment.

The Czochralski (pulling-up) process is allowed to proceed using an apparatus based on high-frequency induction heating.

The Czochralski method is a method of manufacturing a single crystal, by which a source material is placed into a crucible, the crucible is heated so as to melt the source material placed therein, and a seed crystal is dipped into the molten source material and pulled up so as to allow the single crystal to grow.

More specifically, this is a method of manufacturing a single crystal based on the pulling-up process, wherein the ratio of temperature gradient between the center and outer end of the single crystal as viewed on the horizontal section over the span of length of pulling-up is controlled to as small as 1.25 or below, and particularly to 1 or around, by intercepting the radiation heat directed from the surface of the molten crystal to the single crystal grown up while being pulled up above the molten crystal, by promoting heat radiation from the upper solidified portion of the single crystal, so as to moderate the temperature gradient in the direction of axis of the single crystal over the span of length of pulling-up ranging from the lower portion, which falls on the melting point side, up to the top portion thereof, and by keeping the temperature of the single crystal through suppression of heat radiation from the outer circumferential surface portion thereof, over the span of length of pulling-up ranging from the lower portion, which falls on the melting point side, up to the top portion thereof.

The method of manufacturing the scintillator single crystal is given as a method of manufacturing a fluoride-base scintillation single crystal, if p=0 is defined in the composition of the molten crystal expressed by the general formula described in the above.

This sort of method of manufacturing can specifically be exemplified by a method of growing the single crystal based on the micro-pulling-down process, by adopting the molten crystal having a composition which allows a single crystal expressed by $Pr_wM_xRE_yF_z$ to produce, and a Pr concentration of 5w to 15w.

In this case, RE is any one species, or two or more species selected from La, Ce, Yb, Lu and Y, M is any one species, or more species selected from Li, Na, K, Cs, Rb, Mg, Ca, Sr, Ba and Al, and $0.0001 \leq w<0.3$, $0<x<10$, $0<y<10$ and $0<z<50$.

It is to be noted herein that, as described previously, the Pr concentration w falls in the range of $0.0001 \leq w<0.3000$, preferably $0.0010 \leq w<0.0500$, and more preferably $0.0020 \leq w \leq 0.0200$. Because x, y and z are arbitrarily determined depending on the crystal composition, and are therefore not specifically limited, wherein they are preferably $0<x<10.0000$ and more preferably $0<x<4.0000$, $0<y<10.0000$ and more preferably $0<y<4.0000$, and $0<z<50.0000$ and more preferably $0<z<20.0000$.

In the method of manufacturing the fluoride-base scintillator single crystal, the starting materials applicable herein may be any general fluoride materials, but for the case where use as the scintillator single crystal is aimed at, use of high-purity source materials of 99.9% or above (3N or above) is particularly preferable, wherein these starting materials are weighed and mixed so as to attain a target composition. It is particularly preferable that these source materials are extremely low in the content of impurities other than target components (1 ppm or below, for example). The source materials used herein are preferably such as having an oxygen concentration of 1,000 ppm or below, and particularly preferably such as having an oxygen concentration of 100 ppm or below. However, even for the case where the source materials having high oxygen concentrations are used, a crystal of high quality can be obtained by pre-treating the materials under an atmosphere of a fluorine compound gas, or by adding a 10% or smaller amount of a fluorine compound as a scavenger, so as to produce a melt of low oxygen state (100 ppm or below, for example) at the time of crystal growth.

The fluoride-base scintillator material expressed by $Pr_wM_xRE_yF_z$ or $Pr_wM_xF_z$, containing rare earth fluoride, can readily be converted into rare earth oxyfluorides if a trace amount of oxygen remains.

The crystal growth is preferably allowed to proceed under a vacuum atmosphere, an inert gas atmosphere, extremely-low-oxygen atmosphere, and further in a fluorine-compound-containing atmosphere. The same will apply not only to the step of crystal growth (single crystal manufacturing step), but also to the pre-processes such as melting the source materials, and to the post-processes such as annealing. The fluorine-compound-containing gas used herein is particularly preferably $CF_4$ which is generally used, whereas $F_2$ gas, HF gas, $BF_3$ gas and the like are also applicable. These gases may be used as being diluted with an inert gas (Ar, $N_2$, He, etc., for example).

As the method of manufacturing the fluoride-base scintillator single crystal expressed by $Pr_wM_xRE_yF_z$ or $Pr_wM_xF_z$ of this embodiment, any of the micro-pulling-down process, the Czochralski method (pulling-up process), the Bridgeman method, the zone melting process, or the EFG process and so forth are adoptable without special limitation, wherein the Czochralski method or the Bridgeman method is preferable, in view of obtaining a large-sized single crystal for the purpose of improving the yield ratio and relatively reducing the process loss. On the other hand, so far as only a small-sized single crystal is used as the scintillator single crystal, the zone melting process, the EFG process, the micro-pulling-down process and the Czochralski method are preferable because there is no need, or only a small need of post-processing, wherein the micro-pulling-down process and the zone melting process are particularly preferable, for reasons of wettability with the crucible and so forth. The concentration of Pr contained in the molten crystal at the time of charging is adjusted to approximately 5 to 15 times as much as the target amount of incorporation, although being susceptible to change depending on the process of manufacturing to be adopted.

Because the melting points of all of the fluoride-base source materials adopted herein are lower than 1,300° C., a temperature of lower than 1,300° C. is good enough in any of crystal growth techniques including the micro-pulling-down process, the Czochralski method, the Bridgeman method, the zone melting process and the EFG process. Therefore, output of the high-frequency oscillator can significantly be lowered, and the cost of manufacturing can consequently be reduced. Moreover, not only the high-frequency oscillator, but also a resistor heater is applicable. Although the crucible and the after-heater adopted may be composed of platinum, iridium, rhodium, rhenium, or alloy thereof, it is made possible herein to use carbon, which is not suitable for the step of forming the oxide crystal such as GSO, so that the cost of manufacturing can further be reduced.

For example, $K(Y_{0.99}Pr_{0.01})_3F_{10}$ has a melting point of 1,050° C., indicating that it is extremely lower than 2,150° C. shown by Ce:LSO.

Paragraphs below will describe the method of manufacturing the fluoride-base scintillator single crystal of this embodiment, referring to an exemplary method of manufacturing a single crystal based on the micro-pulling-down process, without limiting the invention.

The micro-pulling-down process is allowed to proceed using an atmosphere-adjustable, micro-pulling-down apparatus making use of high-frequency induction heating. The micro-pulling-down apparatus has a crucible, a seed holding jig holding a seed to be brought into contact with a molten crystal discharged from a fine orifice provided at the bottom of the crucible, a moving mechanism moving the seed holding jig downward, a moving speed control device for the moving mechanism, and an induction heating unit heating the crucible. The single crystal manufacturing apparatus is configured to manufacture a single crystal by forming the solid-liquid interface straight under the crucible, and by moving the seed crystal downward.

The crucible is made of carbon, platinum, iridium, rhodium, rhenium, or alloy thereof, and an after-heater, which is a heating element composed of carbon, platinum, iridium, rhodium, rhenium, or alloy thereof, is disposed at the outer circumference of the bottom of the crucible. The crucible and the after-heater are configured as being adjustable in the energy of heat generation through adjustment of the output of the induction heating unit, so as to control the temperature and distribution thereof of the solid-liquid interface area of the molten crystal drawn out from the fine orifice provided to the bottom of the crucible.

This precision atmosphere-controllable, micro-pulling-down apparatus can precisely control the atmosphere in the chamber, so as to enable growth of fluoride crystals. The apparatus is configured as adopting SUS and $CaF_2$ as the materials composing the chamber and the window component, respectively, having a diffusion pump or a turbo molecular pump in addition to an already-equipped rotary pump, so as to enable evacuation to a high degree of vacuum which is most important in the growth of fluoride crystals, so that a degree of vacuum of $1 \times 10^{-3}$ Torr or below can be achieved. The chamber can be supplied with $CF_4$, Ar, $N_2$, $H_2$ gas or the like, after being precisely controlled in the flow rate thereof using an attached gas flow meter.

Using this apparatus, the source material prepared according to the above-described method is placed in the crucible, the inner space of the furnace is evacuated to a high degree of vacuum, baking is carried out so as to remove moisture adhered on the surfaces, and a high-purity Ar gas (6N grade) or a high-purity $CF_4$ gas (6N grade) is introduced into the furnace so as to adjust the inner space of the furnace to an inert gas atmosphere or a fluorine compound gas atmosphere, the crucible is heated by gradually applying high-frequency power to a high-frequency induction heating coil, to thereby completely melt the source material in the crucible.

Next, the crystal is grown according to the procedures below. The seed crystal is gradually elevated at a predetermined speed, the tip thereof is brought into contact with the orifice at the lower end of the crucible so as to thoroughly run it thereinto, and the crystal is grown by descending a pulling-down axis while controlling the temperature of the molten crystal. The seed crystal is preferably equivalent to a target substance to be grown up to a crystal, or such as having both of structure and composition close thereto, but is not limited thereto. The seed crystal used herein preferably has clearly defined orientation. The crystal growth comes to the end, when the entire portion of the available material crystallizes leaving no residual molten crystal. On the other hand, a device for consecutive charging of the source material may be incorporated, for the purpose of keeping the composition uniform, and of producing a long crystal.

Also in the method of manufacturing a fluoride-base scintillator single crystal of this embodiment, the above-described, pulling-up process is adoptable.

The oxide or the fluoride-base scintillator single crystal of this embodiment can be configured to give a scintillator, and can further be combined with a radiation detection unit detecting radioactive ray, and with a light receiving unit receiving fluorescence emitted as a result of detection of the radioactive ray by the radiation detection unit, so as to make it available as a radiation detector. It is also allowable to compose a radiation inspection apparatus equipped with the radiation detector.

The radiation inspection apparatus is suitable for applications of medical image processing apparatus, such as positron emission tomography apparatus (PET), X-ray CT, SPECT and the like. As for modes of PET, preferable examples include two-dimensional PET, three-dimensional PET, time-of-flight (TOF) PET and depth-of-interaction (DOI) PET. These may be used in combination.

The light receiving unit used in the radiation detector of this embodiment can be exemplified by position-sensitive photomultiplier (PS-PMT), photodiode (PD) or avalanche-photodiode (APD).

Figure 43:
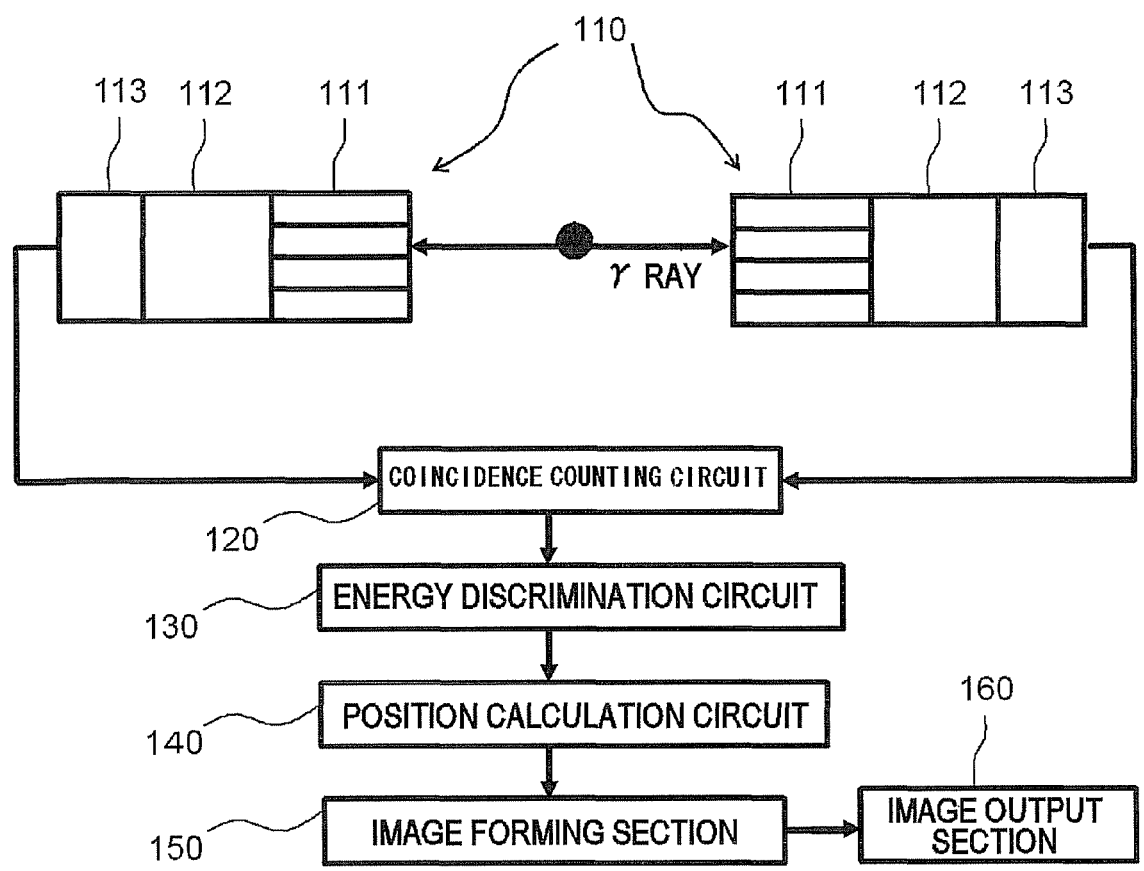
FIG. 43 is a block diagram showing an exemplary configuration of a PET apparatus according to the embodiment.

FIG. 43 shows an exemplary configuration of a PET apparatus according to this embodiment.

A PET apparatus 100 shown in FIG. 43 is composed of a plurality of radiation detectors 110, an arithmetic circuit section (a coincidence counting circuit 120, an energy discrimination circuit 130 and a position calculation circuit 140) processing data received from the individual radiation detectors 110, and an image processing section (an image forming section 150 and an image output section 160) processing results of calculation by the arithmetic circuit section and outputting images.

Each radiation detector 110 is composed of a scintillator array 111, a photomultiplier 112 and an amplifier 113, so as to detect γ ray emitted out from a specific site, and to finally convert it into electric signals.

The scintillator array 111 is configured as having a plurality of scintillators which functions as γ ray detection units arranged in an array. Each scintillator is excited by γ ray, and then causes transition to a more stable energy level, while emitting fluorescence in the ultraviolet wavelength range. The fluorescence is, as described in the above, supposedly ascribable to 5d-4f transition, and have a wavelength of 200 to 350 nm, wherein a fluorescence lifetime of 1 to 300 ns or around, as described later.

Each photomultiplier 112 functions as a light receiving unit receiving the fluorescence. The photomultiplier 112 amplifies the fluorescence emitted from the correspondent scintillator array 111, and converts it into an electric signal.

Thus converted electric signal is amplified by the amplifier 113. In this way, γ ray is detected by each radiation detector 110.

The γ ray detection data of the individual radiation detectors 110 are then fetched by the coincidence counting circuit 120. The coincidence counting circuit 120 correlates these γ ray detection data to identification information of the radiation detector 110 which detected the γ ray, and data acquisition time, and sends the result to the energy discrimination circuit 130.

The energy discrimination circuit 130 extracts preliminarily-determined specific energy data out of the γ ray detection data, and acquires the intensity data. For the case where a Lu-containing scintillator is used, the extracted energy data includes γ ray (511 KeV) emitted from positron, 420-KeV energy generated upon β decay of isotope $^{176}$Lu contained to as much as approximately 2.6% in Lu, and because there is a need of discriminating these energies from those ascribable to γ decay (307 KeV) succeeding to the β decay, an energy window is typically set to 415 KeV, so as to extract only energies thereabove from the γ ray detection data. Also for the case where a Lu-free scintillator is used, there is a similar need of discriminating the positron-derived γ ray and naturally-occurring, high-energy particles such as the cosmic ray present in nature, and this raises a need of setting the energy window.

The position calculation circuit 140 calculates position information of γ ray based on the discrimination information of the radiation detectors 110 detecting the individual γ ray detection data, correlates the result to the intensity data, and sends it to the image forming section 150.

The image forming section 150 produces γ ray intensity distribution data in a tomographic image of a specified site, based on the intensity data correlated to the position information. The γ ray intensity distribution data is output as an image by the image output section 160.

For the case where the radiation inspection apparatus is configured as having the radiation detector as described in the above, the radiation inspection apparatus may be used as a stand-alone apparatus, or may be used for magnetic resonance imaging apparatus (MRI), computed tomography apparatus (CT) and single photon computed tomography (SPECT), or combination-type apparatus.

The radiation detector of this embodiment may be used also for X-ray CT, and radiographic apparatus for radioactive ray transmission inspection, or combination thereof.

As has been described in the above, the scintillator single crystal used for the radiation detector of this embodiment is preferably adoptable to a rapid-response detection of radioactive ray in PET and SPECT, if the wavelength of fluorescence emitted under excitation by gamma ray falls in the range from 200 to 350 nm, and preferably from 200 to 310 nm.

The fluorescence emitted from the scintillator single crystal of this embodiment has a short lifetime, typically characterized by a decay time at room temperature of 1 to 300 nsec, and preferably 1 to 50 nsec.

This sort of scintillator single crystal can successfully realize high energy emission and short fluorescence lifetime (short decay constant) in the ultraviolet region, which could not have been easy to realize, and is expected as being typically applicable to a time-of-flight (TOF) PET.

More specifically, in the measurement (sampling) by PET, the scintillator crystal in the individual radiation detectors corresponded to a specific site is excited by gamma ray from the specific site, fluorescence is generated, and the fluorescence is detected for radiation detection. The next measurement will, therefore, be available only after waiting for sufficient attenuation of the fluorescence emitted from the single crystal of the individual scintillators. By composing the radiation detector with the scintillator using the single crystal described in this embodiment, it is made possible to allow the florescence to attenuate within a short period, and to obtain high-energy emission measurable even in a short period of time. Therefore, large time resolution can be realized, and the number of sampling per a unit time can be increased.

EXAMPLE

Paragraphs below will detail specific examples of the present invention referring to the attached drawings, without limiting the present invention. In Examples below, Pr concentration will be determined either in terms of concentration in crystal or in terms of concentration in molten crystal (as charged), wherein in the individual Examples, the ratio of a concentration as charged to a concentration in crystal was found to follow a relation of approximately 1 to 5.

Example A1

A garnet-type oxide scintillator single crystal expressed by a composition of $(Pr_{0.001}Y_{0.999})_3Al_5O_{12}$ (Pr0.1%:YAG)

was manufactured by the micro-pulling-down process. The obtained crystal is shown in FIG. 1. The single crystal was found to be transparent.

Example A2

Figure 2:
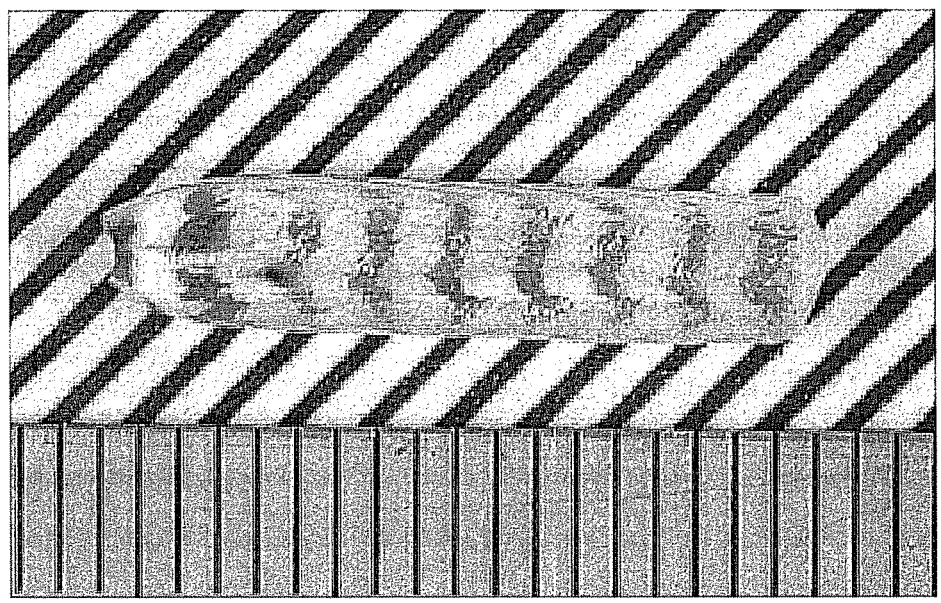
FIG. 2 is a drawing showing $(Pr_{0.002}Y_{0.998})_3Al_5O_{12}$ single crystal (Pr0.2%:YAG) of an embodiment of the present invention.

A garnet-type oxide scintillator single crystal expressed by a composition of $(Pr_{0.002}Y_{0.998})_3Al_5O_{12}$ (Pr0.2%:YAG) was manufactured by the micro-pulling-down process. The obtained crystal is shown in FIG. 2. The single crystal was found to be transparent.

Example A3

Figure 3:
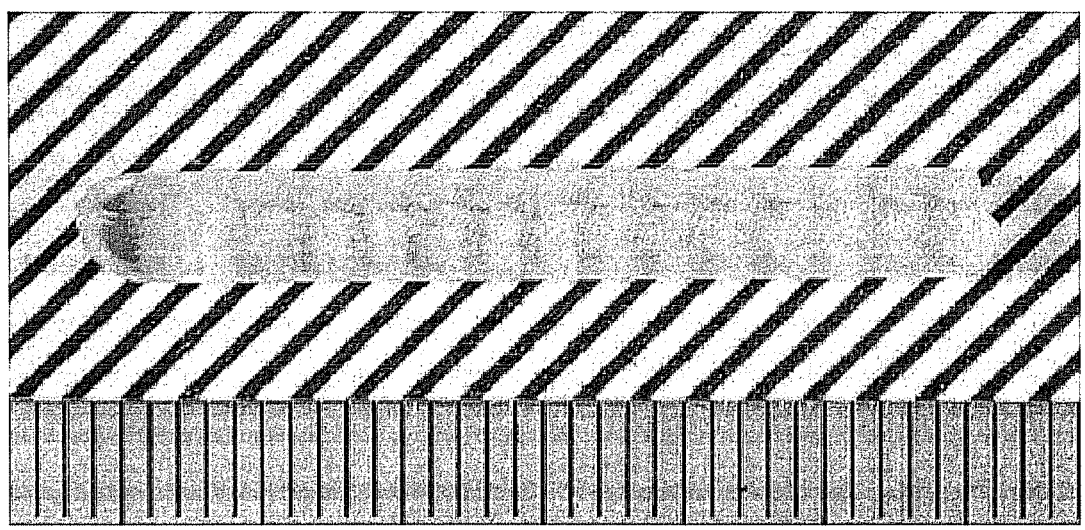
FIG. 3 is a drawing showing $(Pr_{0.001}Lu_{0.999})_3Al_5O_{12}$ single crystal (Pr0.1%:LuAG) of an embodiment of the present invention.

A garnet-type oxide scintillator single crystal expressed by a composition of $(Pr_{0.001}Lu_{0.999})_3Al_5O_{12}$ (Pr0.1%:LuAG) was manufactured by the micro-pulling-down process. The obtained crystal is shown in FIG. 3. The single crystal was found to be transparent.

Example A4

Figure 4:
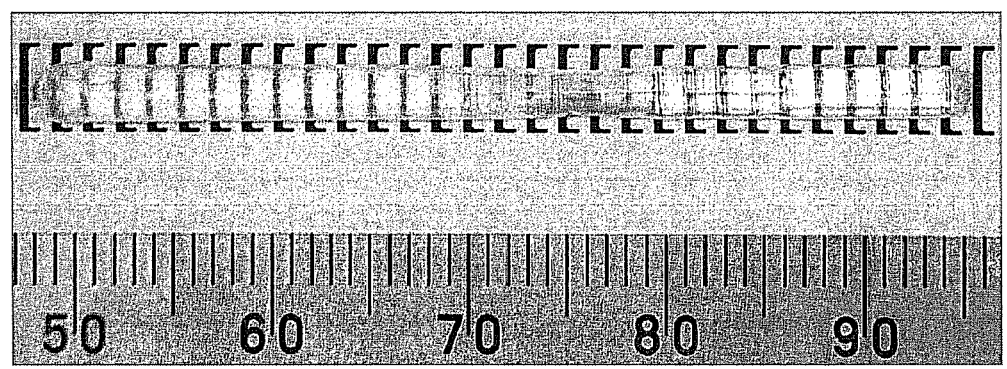
FIG. 4 is a drawing showing $(Pr_{0.002}Lu_{0.998})_3Al_5O_{12}$ single crystal (Pr0.2%:LuAG) of an embodiment of the present invention.

A garnet-type oxide scintillator single crystal expressed by a composition of $(Pr_{0.002}Lu_{0.998})_3Al_5O_{12}$ (Pr0.2%:LuAG) was manufactured by the micro-pulling-down process. The obtained crystal is shown in FIG. 4. The single crystal was found to be transparent.

Example A5

Figure 5:
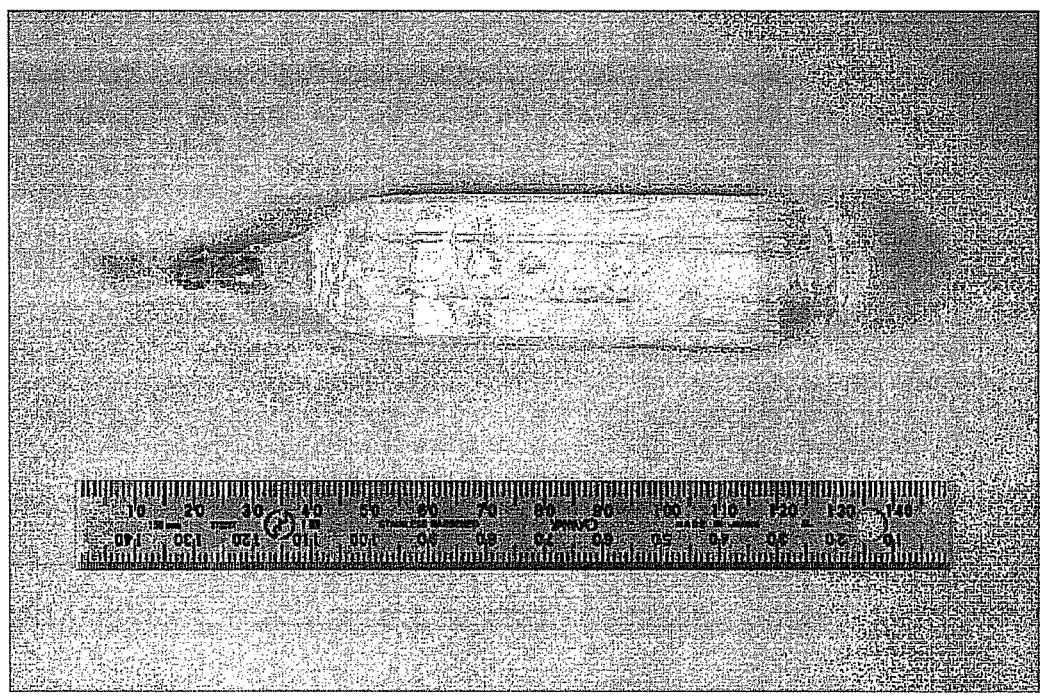
FIG. 5 is a drawing showing $(Pr_{0.002}Y_{0.998})_3Al_5O_{12}$ single crystal (Pr0.2%:YAG) of an embodiment of the present invention.

A garnet-type oxide scintillator single crystal expressed by a composition of $(Pr_{0.002}Y_{0.998})_3Al_5O_{12}$ (Pr0.2%:YAG) was manufactured by the pulling-up process. The obtained crystal is shown in FIG. 5. The single crystal was found to be transparent.

Example A6

Figure 6:
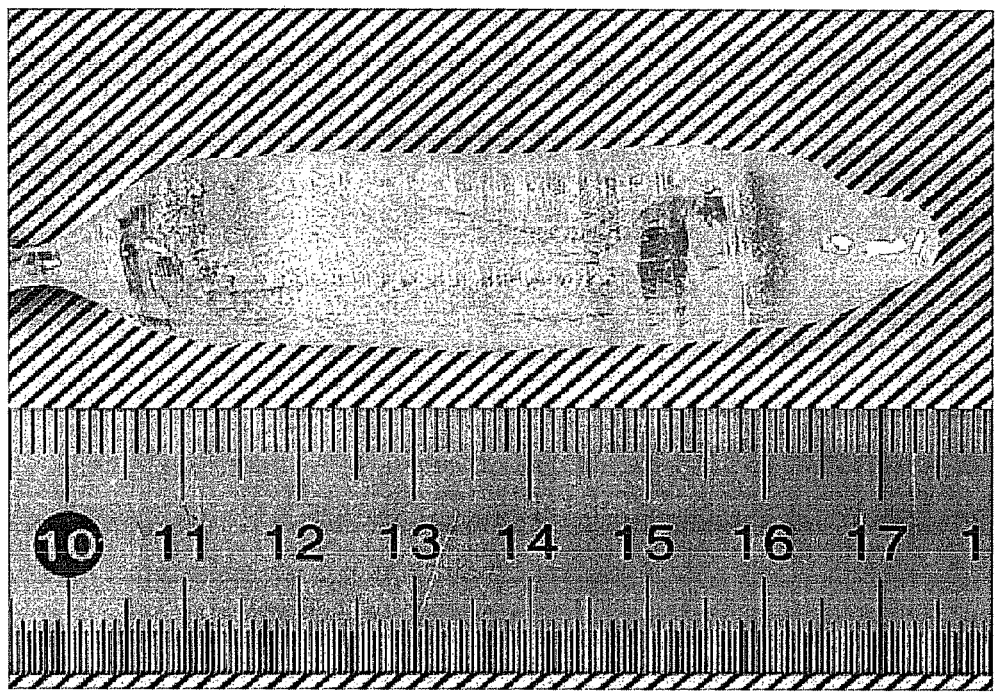
FIG. 6 is a drawing showing $(Pr_{0.002}Lu_{0.998})_3Al_5O_{12}$ single crystal (Pr0.2%:LuAG) of an embodiment of the present invention.

A garnet-type oxide scintillator single crystal expressed by a composition of $(Pr_{0.002}Lu_{0.998})_3Al_5O_{12}$ (Pr0.2%:LuAG) was manufactured by the pulling-up process. The obtained crystal is shown in FIG. 6. The single crystal was found to be transparent.

Example A7

Figure 7:
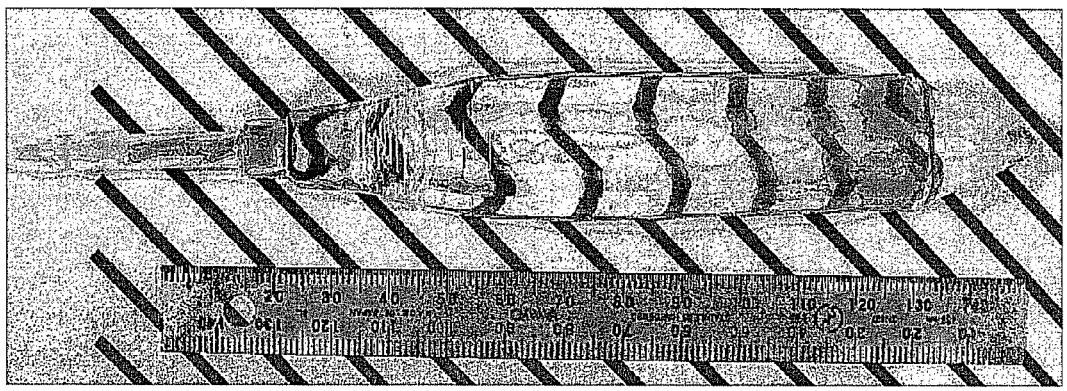
FIG. 7 is a drawing showing $(Pr_{0.002}Y_{0.998})_2SiO_5$ single crystal (Pr0.2%:YSO) of an embodiment of the present invention, the emission peak of BGO given at a 10× magnification for comparison.

A silicate oxide scintillator single crystal expressed by a composition of $(Pr_{0.002}Y_{0.998})_2SiO_5$ (Pr0.2%:$Y_2SiO_5$) was manufactured by the pulling-up process. The obtained crystal is shown in FIG. 7. The single crystal was found to be transparent.

Figure 8:
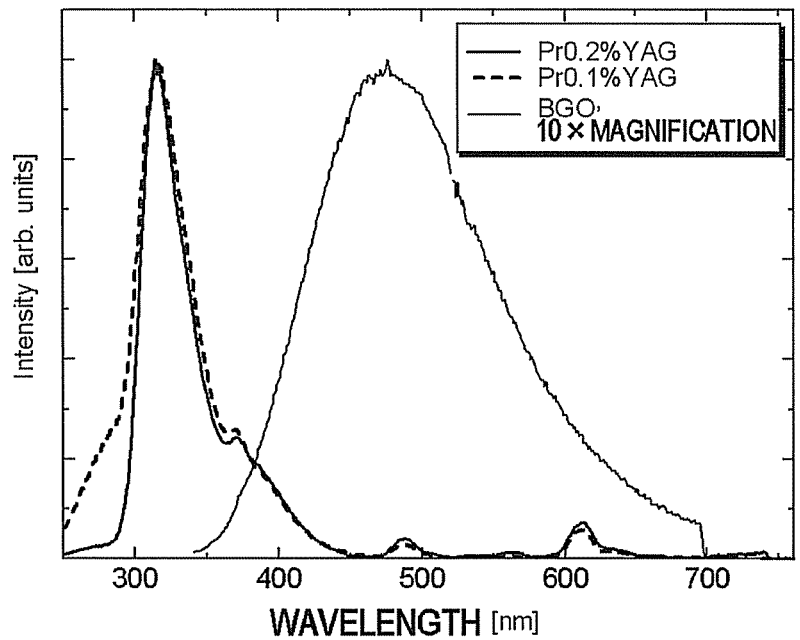
FIG. 8 is a graph showing profiles of results of emission characteristics of Pr0.1%:YAG, Pr0.2%:YAG and BGO measured by radio-luminescence, the emission peak of BGO given at a 10× magnification for comparison.
Figure 9:
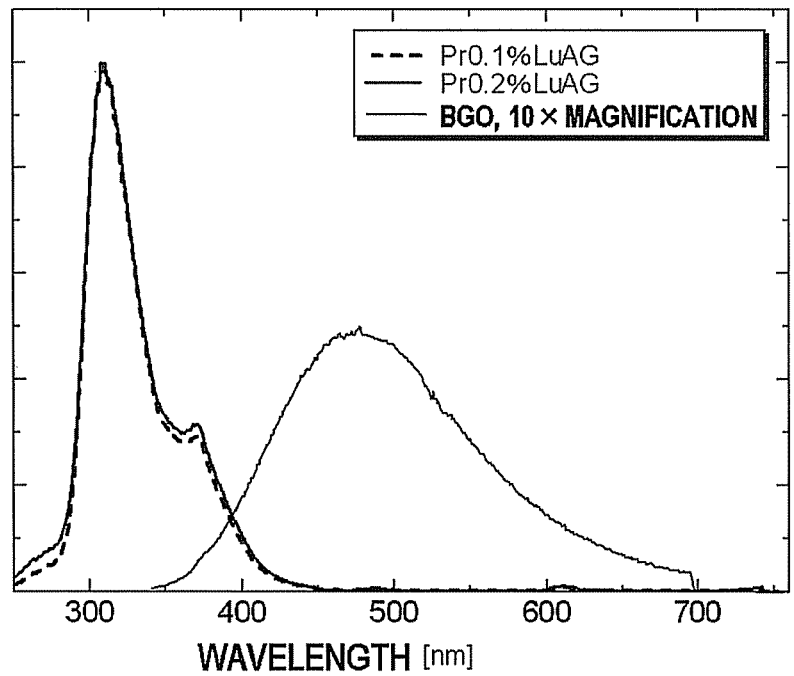
FIG. 9 is a graph showing profiles of results of emission characteristics of Pr0.1%:LuAG, Pr0.2%:LuAG and BGO measured by radio-luminescence, the emission peak of BGO given at a 10× magnification for comparison.
Figure 10:
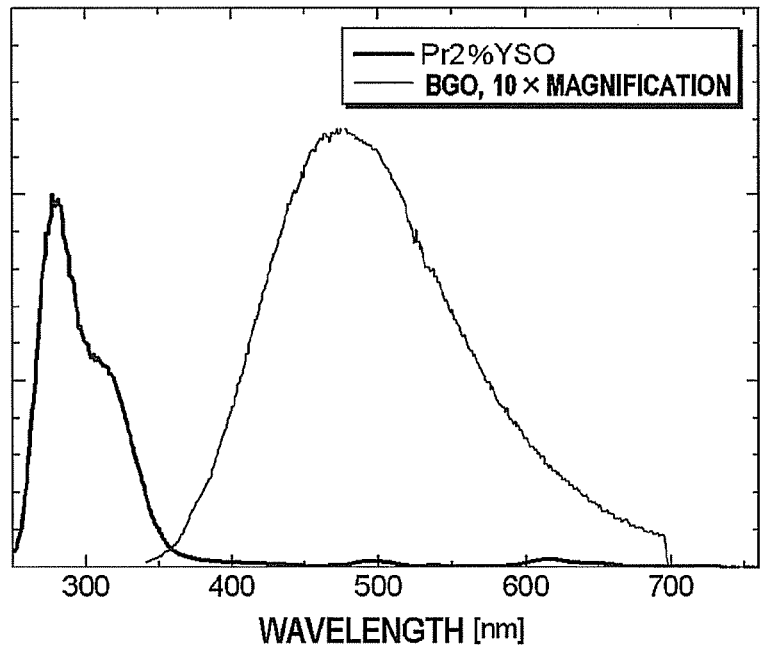
FIG. 10 is a graph showing profiles of results of emission characteristics of Pr0.2%:YSO and BGO measured by radio-luminescence, the emission peak of BGO given at a 10× magnification for comparison.
Figure 11:
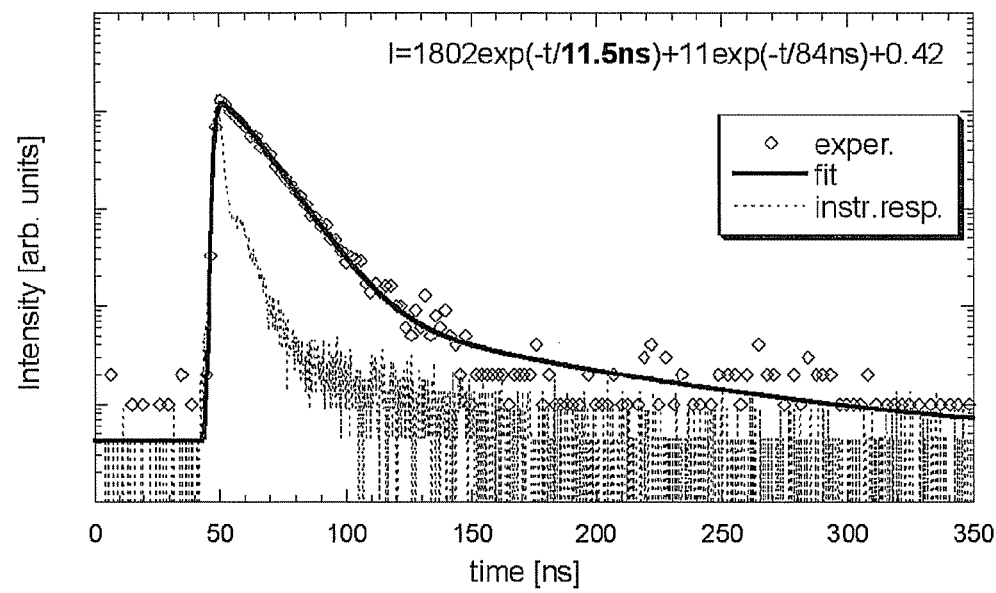
FIG. 11 is a graph showing a profile of fluorescence decay time (photo-luminescence decay) of Pr0.2%:YAG. Data expressing a fluorescence lifetime of as short as 11.5 nsec was obtained.
Figure 12:
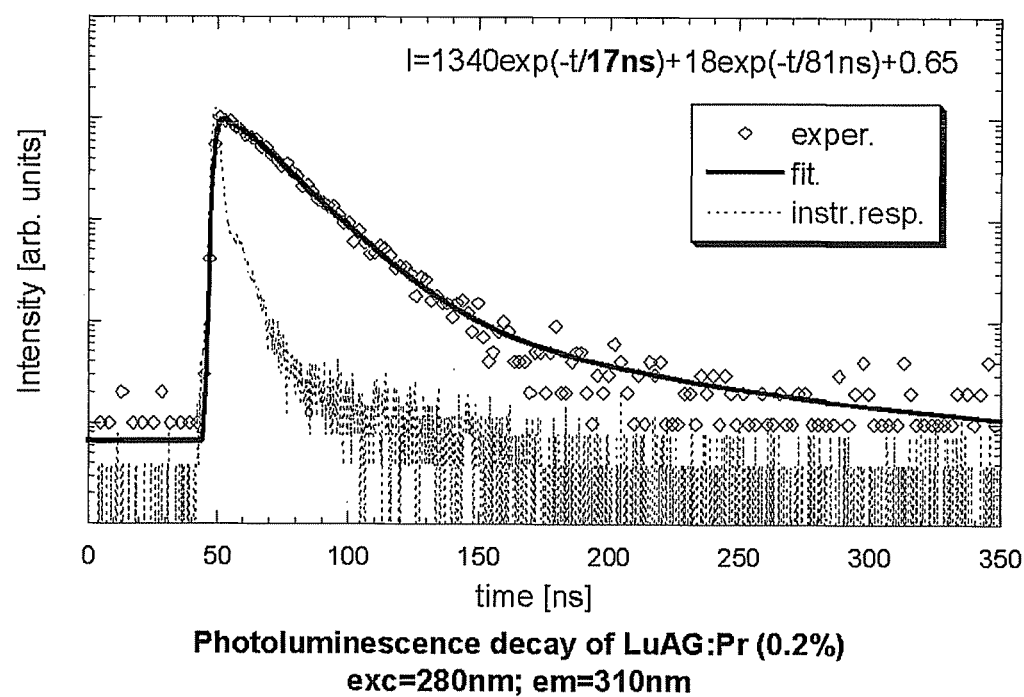
FIG. 12 is a graph showing a profile of fluorescence decay time (photo-luminescence decay) of Pr0.2%:LuAG. Data expressing a fluorescence lifetime of as short as 17 nsec was obtained.
Figure 13:
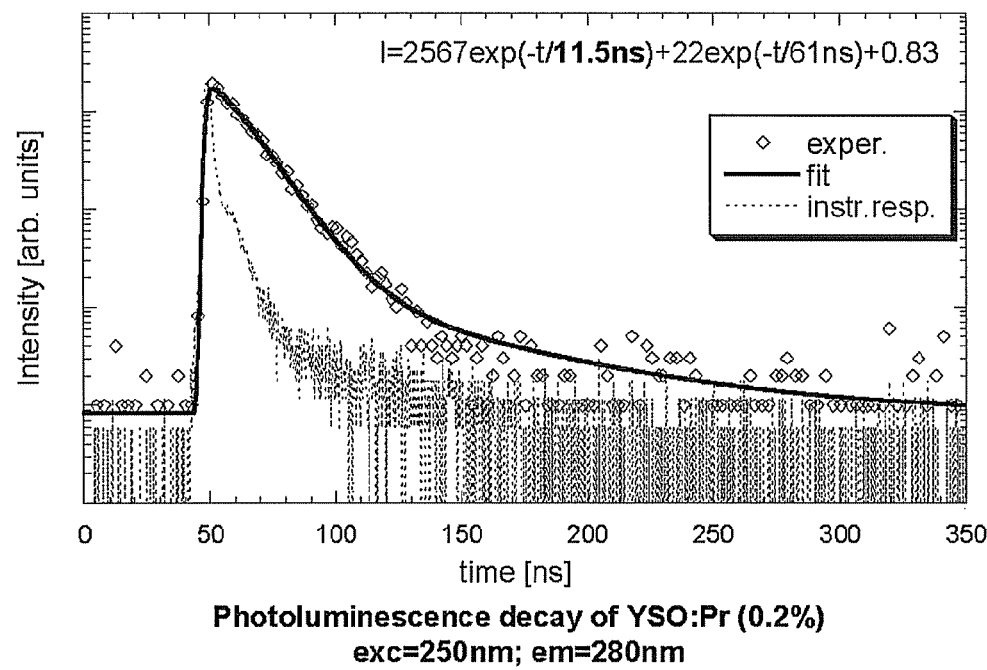
FIG. 13 is a graph showing a profile of fluorescence decay time (photo-luminescence decay) of Pr0.2%:YSO. Data expressing a fluorescence lifetime of as short as 11.5 nsec was obtained.

FIG. 8 is a graph showing profiles of results of emission characteristics of Pr0.1%:YAG, Pr0.2%:YAG and BGO measured by radio-luminescence (X-ray excitation: CuKα), and FIG. 9 is a graph showing profiles of results of emission characteristics of Pr0.1%:LuAG, Pr0.2%:LuAG and BGO measured by radio-luminescence (X-ray excitation: CuKα). In addition, FIG. 10 is a graph showing profiles of results of emission characteristics of Pr0.2%:YSO and BGO measured by radio-luminescence (X-ray excitation: CuKα). All of these drawings comparatively show an emission peak of BGO at a 10× magnification. FIG. 11, FIG. 12 and FIG. 13 are graphs showing profiles of fluorescence decay time (photo-luminescence decay) of Pr0.2%:YAG, Pr0.2%:LuAG and Pr0.2%:YSO, respectively, obtained by measurement of photo-luminescence.

As is known from these results, emission of the scintillator single crystals composed of the Pr-containing oxides of the present invention show extremely large values of absolute light yield ratio. It is also found that the fluorescence decay time is shorter than 20 nsec, proving their great excellence as scintillator materials.

It is to be noted that the emission of the scintillator single crystal composed of the Pr-containing oxides include also slow components. However, by virtue of their extremely large absolute light yield ratio, they prevail over BGO, GSO and so forth to a sufficient level only by contribution of the short-lifetime components, for the purpose of PET. It is suggested that, by using also emission ascribable to slow components for applications of non-destructive inspection such as X-ray CT, radioactive ray transmission inspection apparatus and so forth, they can be used as the scintillator single crystals having still larger values of absolute light yield ratio.

Example B1

Figure 14:
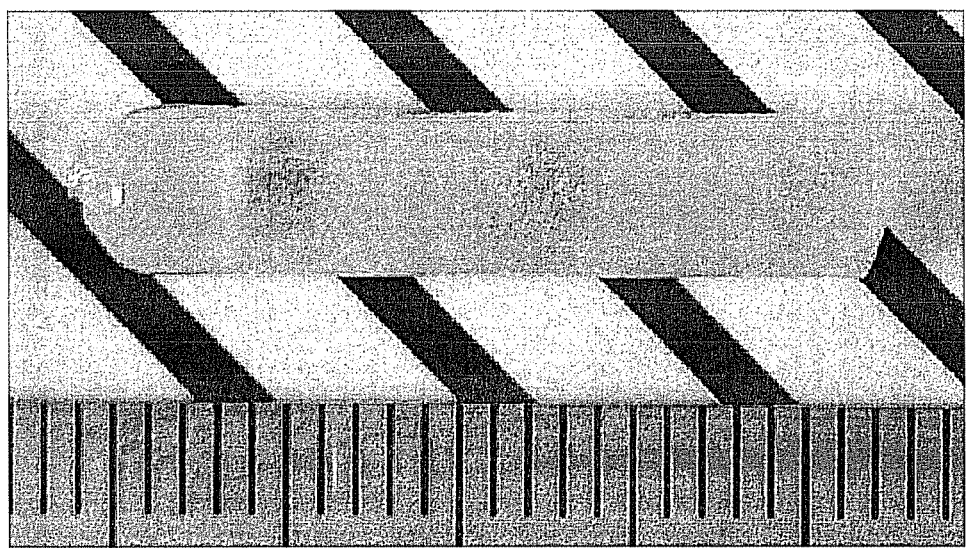
FIG. 14 is a drawing showing $(Pr_{0.002}Y_{0.998})_3(Sc_{0.01}Al_{0.99})_5O_{12}$ single crystal (Pr0.2%, Sc1%:YAG) manufactured by the micro-pulling-down process according to Example of the present invention.

A garnet-type oxide scintillator single crystal expressed by a composition of $(Pr_{0.002}Y_{0.998})_3(Sc_{0.01}Al_{0.99})_5O_{12}$ (Pr0.2%, Sc1%:YAG) was manufactured by the micro-pulling-down process. The obtained crystal is shown in FIG. 14. The single crystal was found to be transparent.

Example B2

Figure 15:
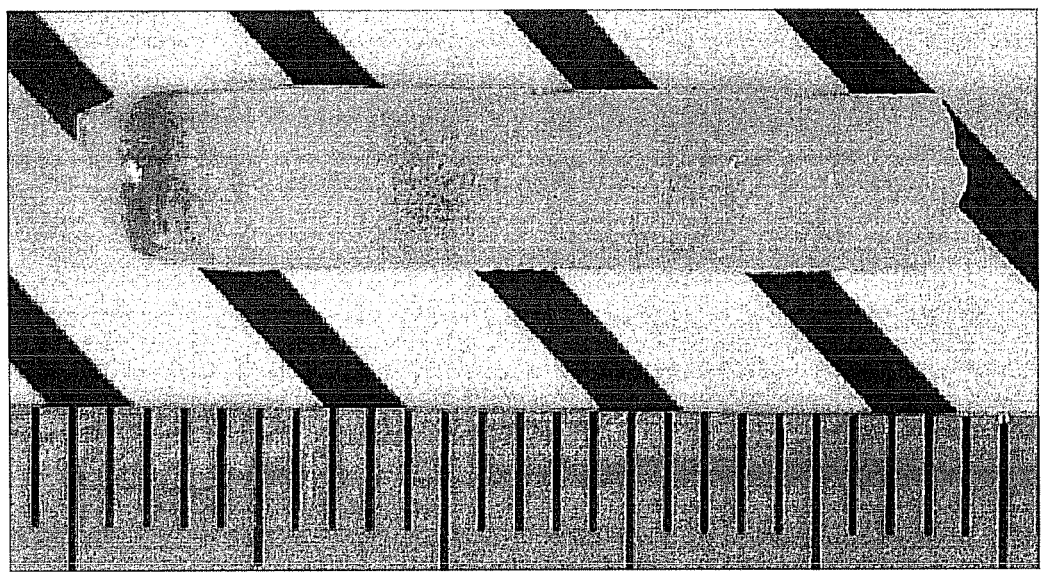
FIG. 15 is a drawing showing $(Pr_{0.002}Lu_{0.998})_3(Sc_{0.01}Al_{0.99})_5O_{12}$ single crystal (Pr0.2%, Sc1%:LuAG) according to Example of the present invention.

A garnet-type oxide scintillator single crystal expressed by a composition of $(Pr_{0.002}Lu_{0.998})_3(Sc_{0.01}Al_{0.99})_5O_{12}$ (Pr0.2%, Sc1%:LuAG) was manufactured by the micro-pulling-down process. The obtained crystal is shown in FIG. 15. The single crystal was found to be transparent.

Example B3

Figure 16:
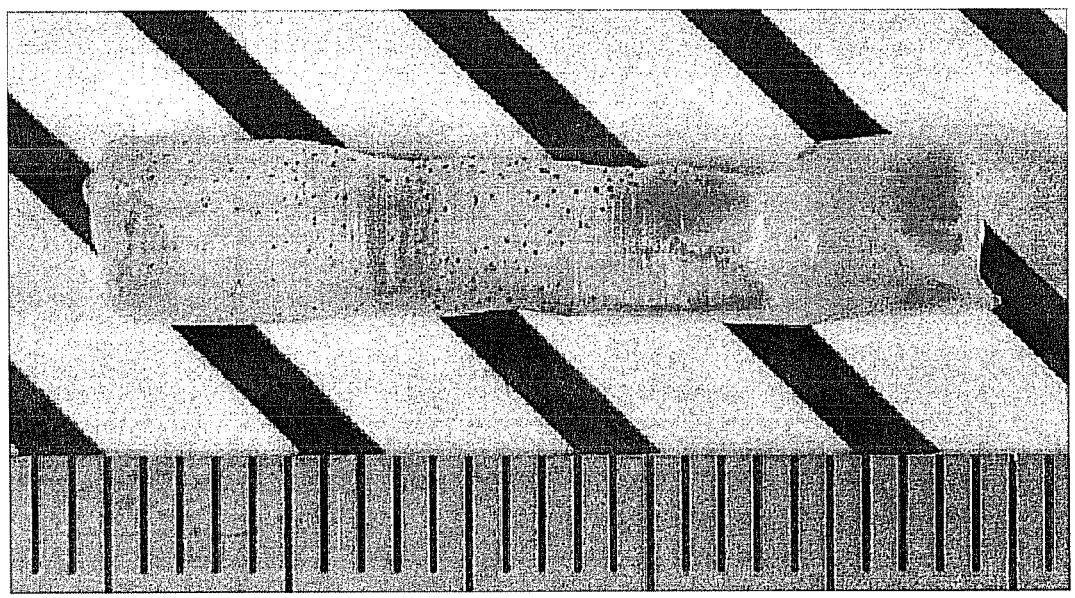
FIG. 16 is a drawing showing $(Pr_{0.002}Lu_{0.998})_3(Mg_{0.05}Al_{0.90}Hf_{0.05})_5O_{12}$ single crystal (Pr0.2%, Mg5%, Hf5%:LuAG) according to Example of the present invention.

A garnet-type oxide scintillator single crystal expressed by a composition of $(Pr_{0.002}Lu_{0.998})_3(Mg_{0.05}Al_{0.90}Hf_{0.05})_5O_{12}$ (Pr0.2%, Mg5%, Hf5%:LuAG) was manufactured by the micro-pulling-down process. The obtained crystal is shown in FIG. 16. The single crystal was found to be transparent.

Example B4

Figure 17:
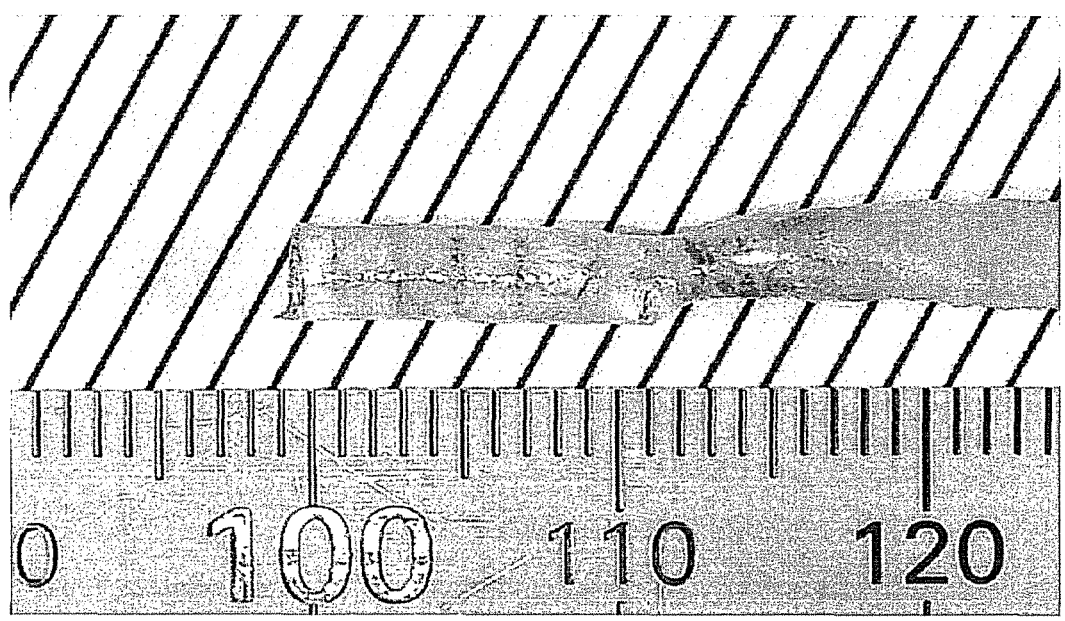
FIG. 17 is a drawing showing $(PrY)_2O_3$ single crystal (Pr1%-as-charged:$Y_2O_3$) according to one Example of the present invention.

An oxide scintillator single crystal expressed by a composition of $(PrY)_2O_3$ (Pr1%-as-charged:$Y_2O_3$) was manufactured by the micro-pulling-down process. The obtained crystal is shown in FIG. 17. The single crystal was found to be transparent.

Example B5

Figure 18:
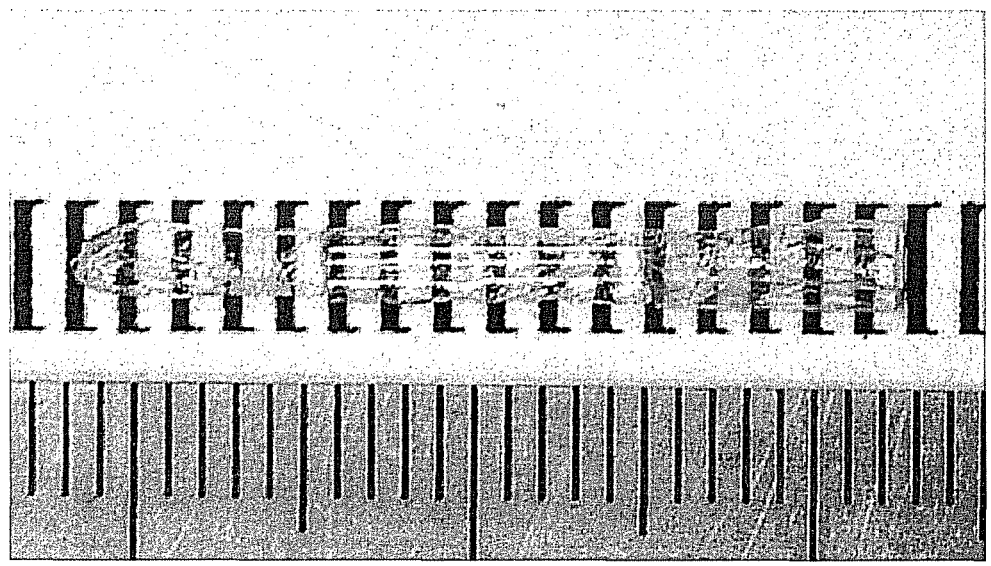
FIG. 18 is a drawing showing $(PrY)AlO_3$ single crystal (Pr1%-as-charged:YAP) according to one Example of the present invention.

A perovskite-type oxide scintillator single crystal expressed by a composition of $(PrY)AlO_3$ (Pr1%-as-charged:YAP) was manufactured by the micro-pulling-down process. The obtained crystal is shown in FIG. 18. The single crystal was found to be transparent.

Example B6

Figure 19:
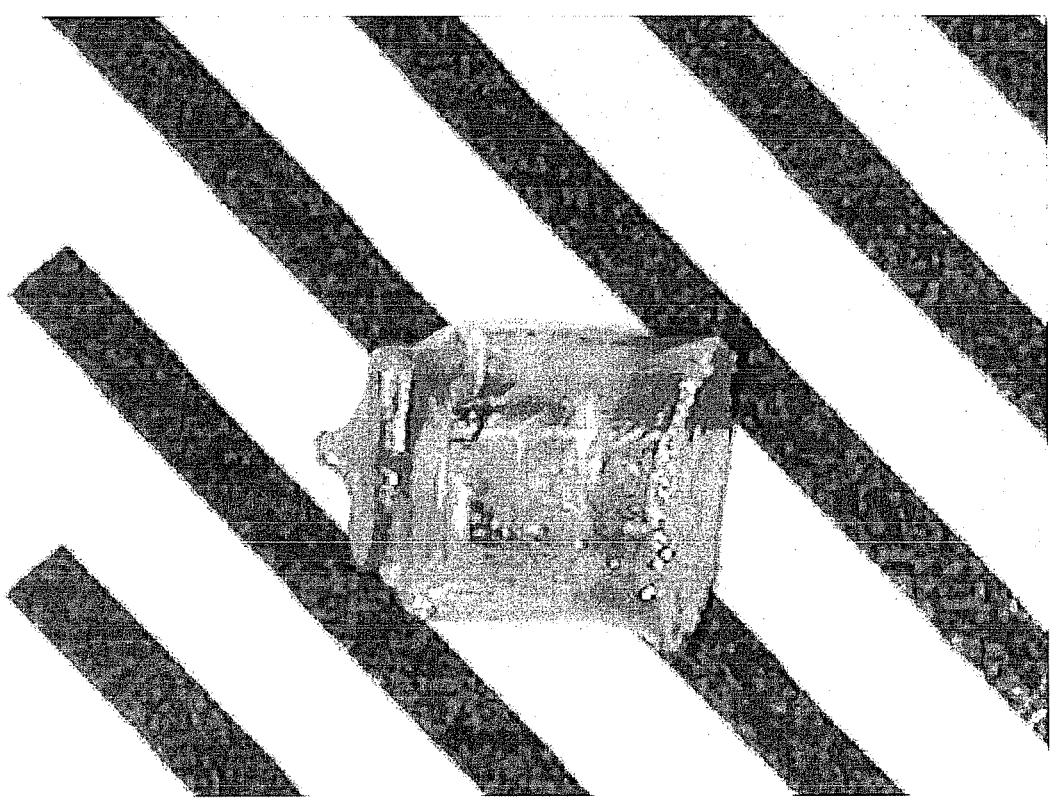
FIG. 19 is a drawing showing $(PrLu)VO_4$ single crystal (Pr1%-as-charged:$LuVO_4$) according to one Example of the present invention.

An oxide scintillator single crystal expressed by a composition of $(PrLu)VO_4$ (Pr1%-as-charged:$LuVO_4$) was manufactured by the micro-pulling-down process. The obtained crystal is shown in FIG. 19. The single crystal was found to be transparent.

Example B7

Figure 20:
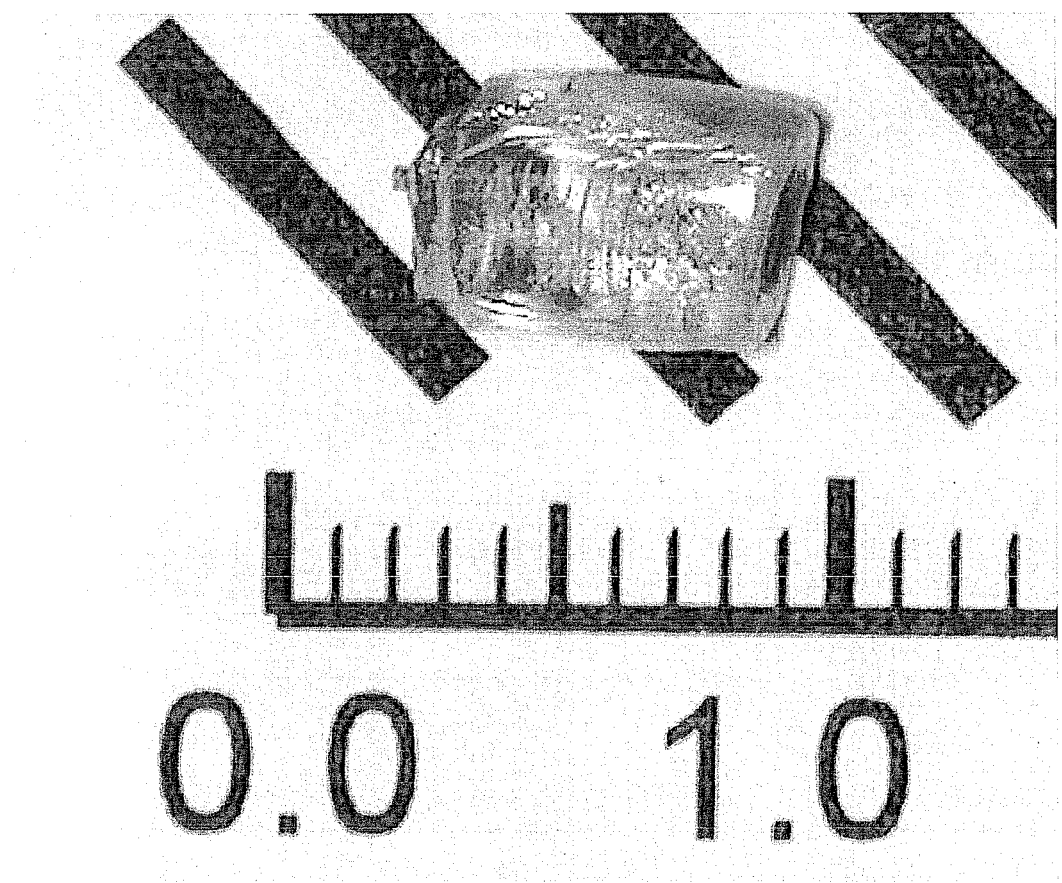
FIG. 20 is a drawing showing $(Pr_{0.002}La_{0.998})LuO_3$ single crystal (Pr0.2%:$LaLuO_3$) according to one Example of the present invention.

A perovskite-type oxide scintillator single crystal expressed by a composition of $(Pr_{0.002}La_{0.998})LuO_3$ (Pr0.2%:LaLuO$_3$) was manufactured by the micro-pulling-down process. The obtained crystal is shown in FIG. 20. The single crystal was found to be transparent.

Example B8

Figure 21:
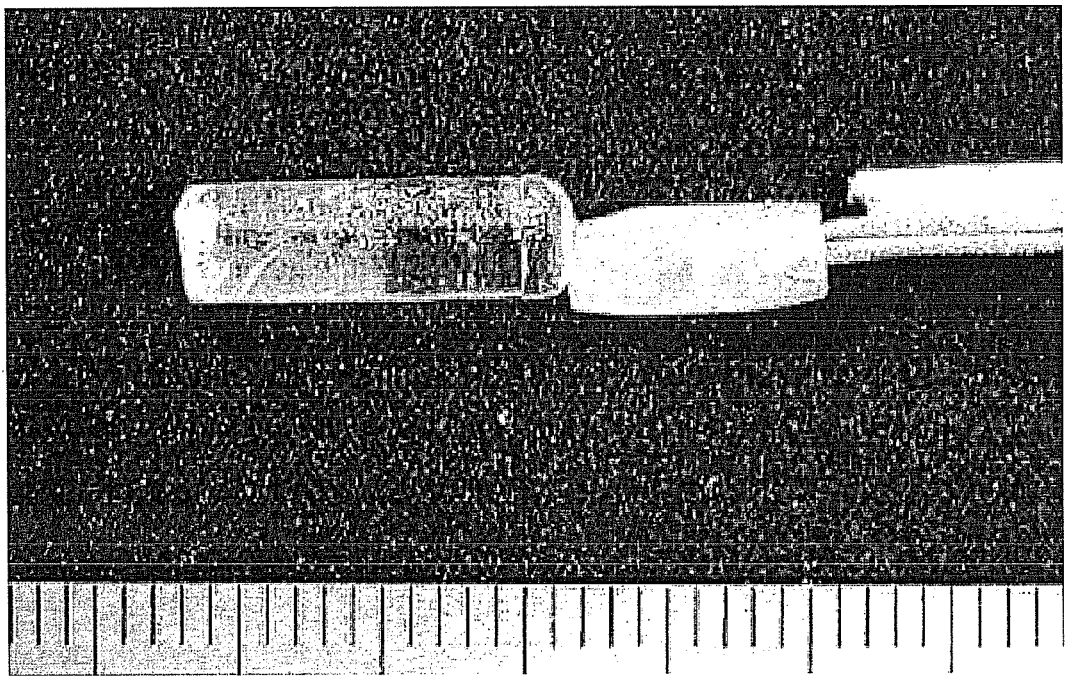
FIG. 21 is a drawing showing $(Pr_{0.002}Lu_{0.998})_2Si_2O_7$ single crystal (Pr0.2%:$Lu_2Si_2O_7$) according to one Example of the present invention.

An oxide scintillator single crystal expressed by a composition of $(Pr_{0.002}Lu_{0.998})_2Si_2O_7$ (Pr0.2%:Lu$_2$Si$_2$O$_7$) was manufactured by the micro-pulling-down process. The obtained crystal is shown in FIG. 21. The single crystal was found to be transparent.

Figure 22:
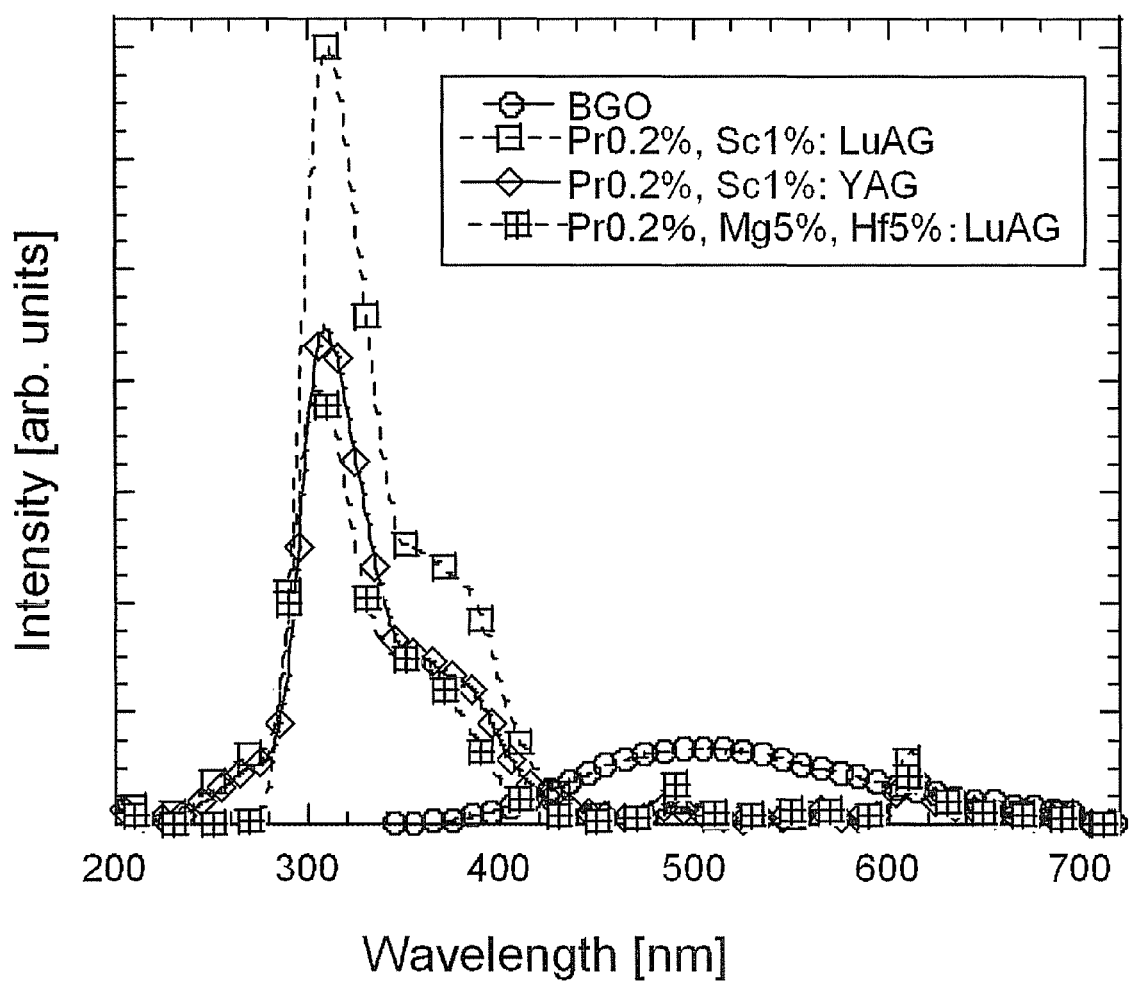
FIG. 22 is a graph showing radio-luminescence profiles (X-ray excitation: CuKα) of Pr0.2%, Sc1%:YAG:Pr0.2%, Sc1%:LuAG:Pr0.2%, Mg5%, Hf5%; LuAG and BGO.
Figure 23:
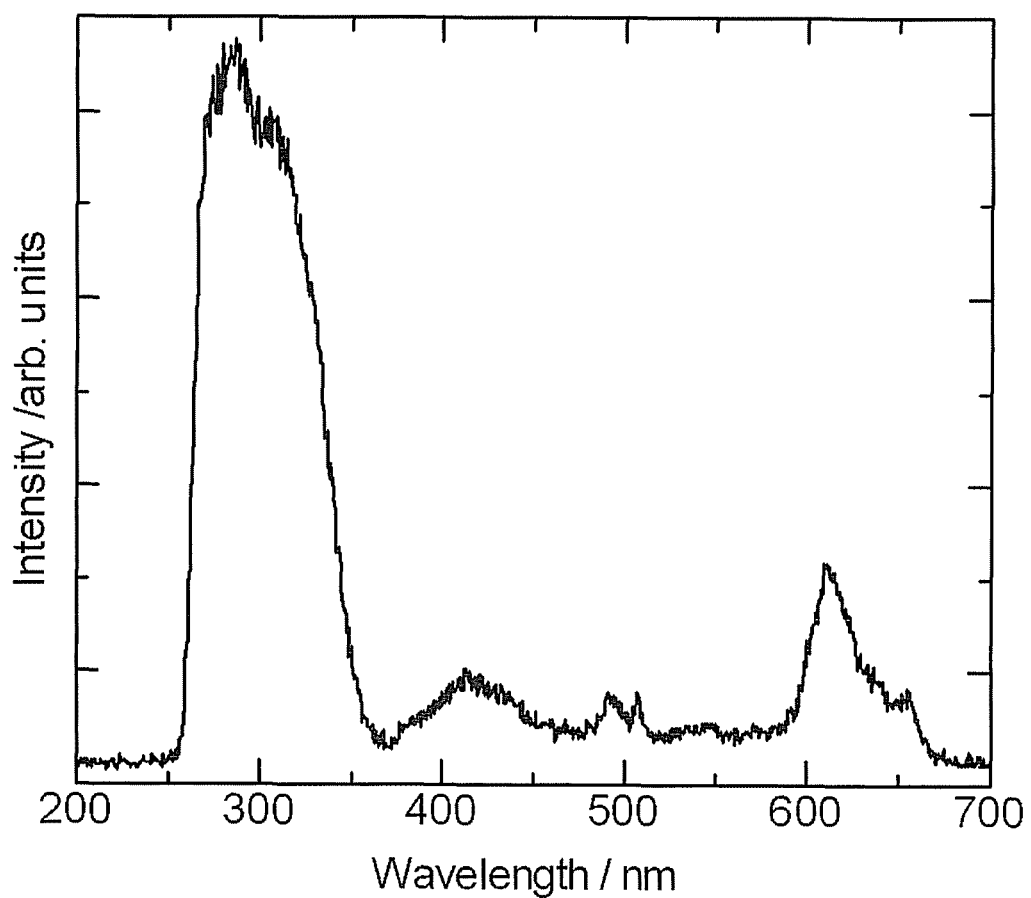
FIG. 23 is a graph showing a radio-luminescence profile (X-ray excitation: CuKα) of Pr1% (as charged):$Y_2O_3$.
Figure 24:
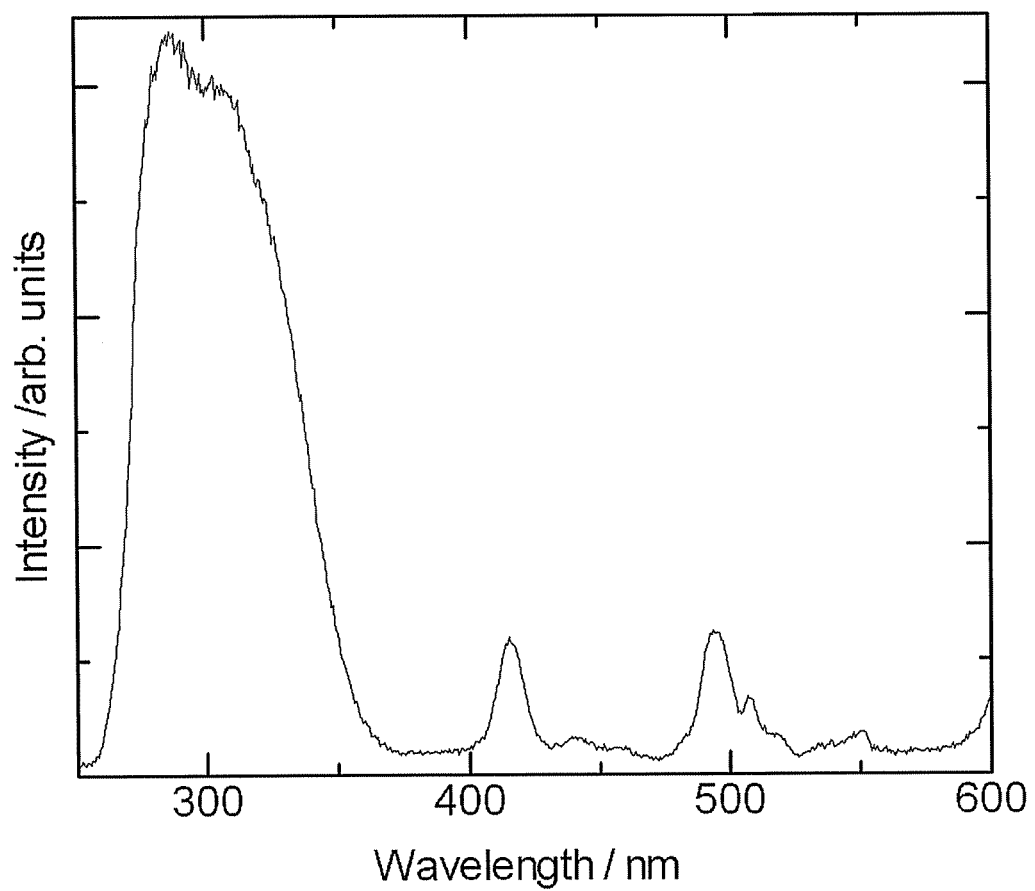
FIG. 24 is a graph showing a radio-luminescence profile (X-ray excitation: CuKα) of Pr1% (as charged):YAP.
Figure 25:
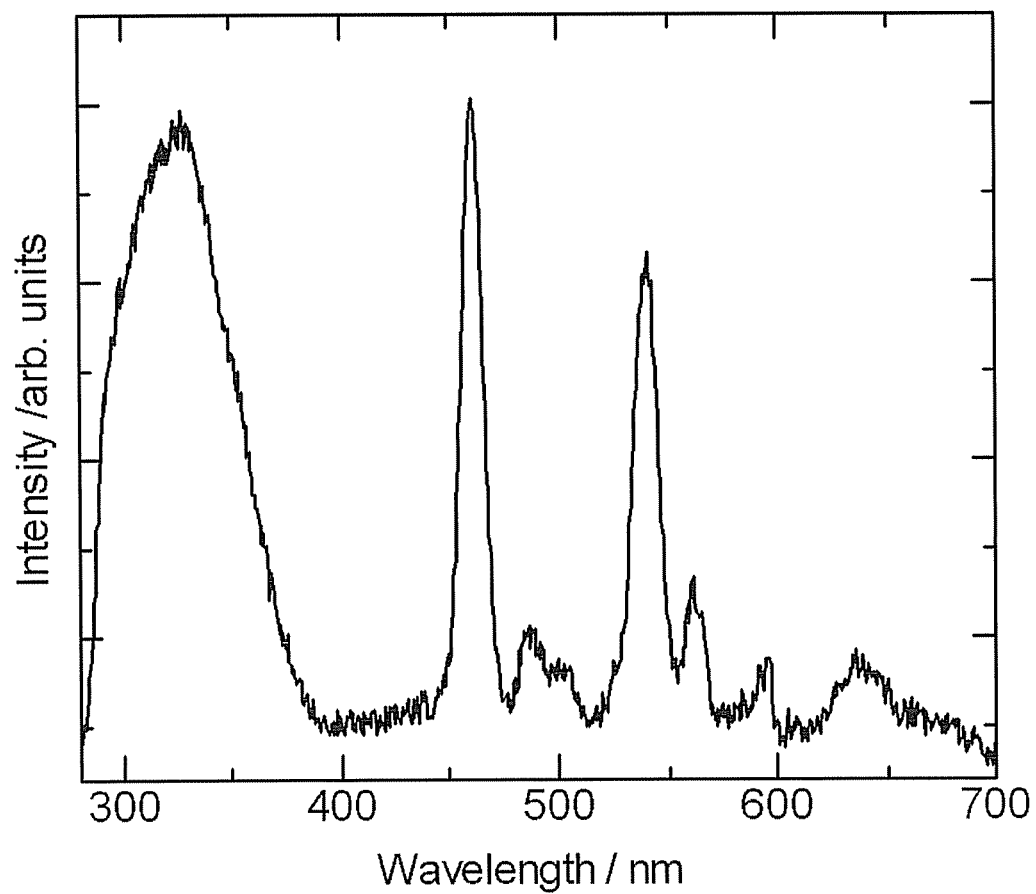
FIG. 25 is a graph showing a radio-luminescence profile (X-ray excitation: CuKα) of Pr1% (as charged):$YVO_4$.
Figure 26:
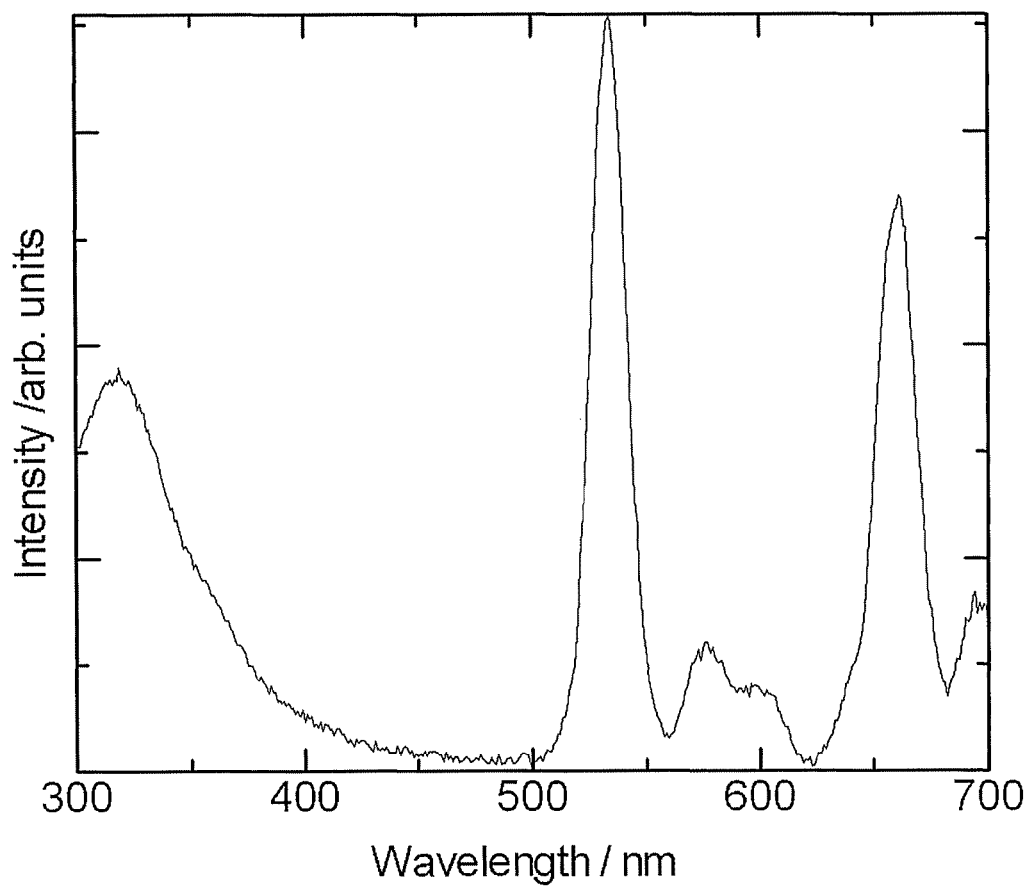
FIG. 26 is a graph showing a radio-luminescence profile (X-ray excitation: CuKα) of Pr0.2%:$LaLuO_3$.
Figure 27:
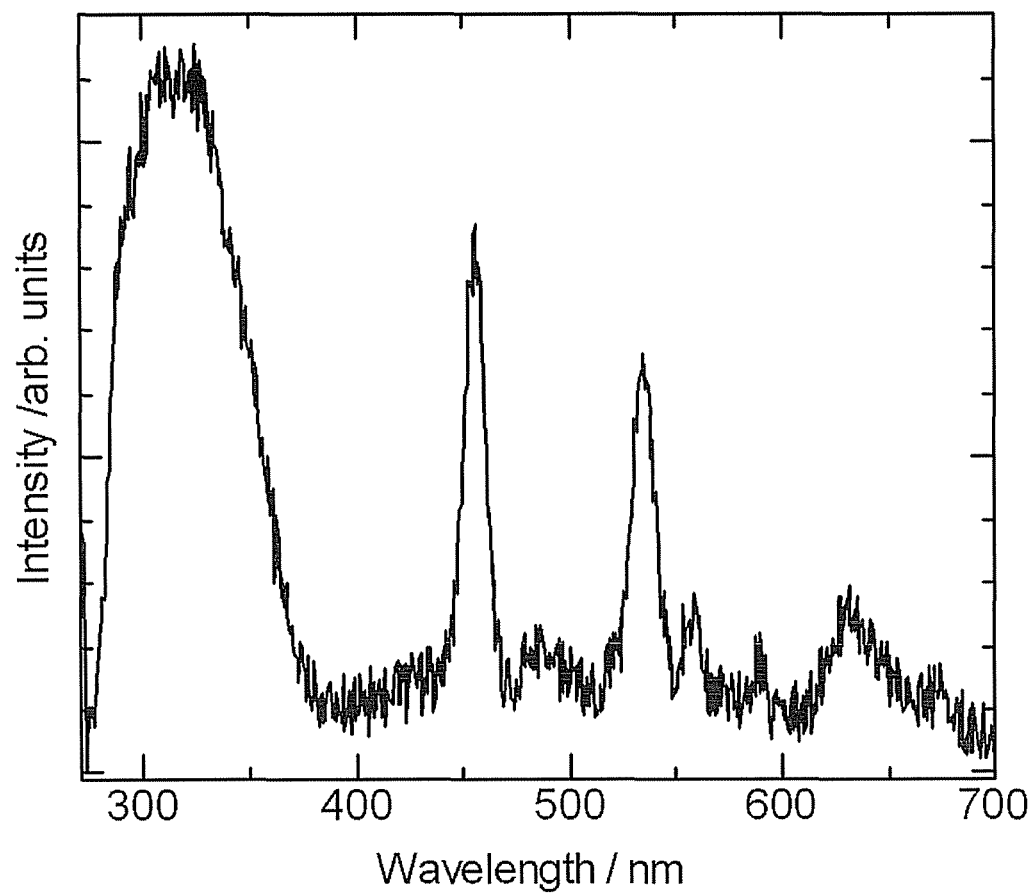
FIG. 27 is a graph showing a radio-luminescence profile (X-ray excitation: CuKα) of Pr0.2%:$Lu_2Si_2O_7$.

FIG. 22 is a graph showing profiles of emission characteristics of Pr0.2%,Sc1%:YAG, Pr0.2%,Sc1%:LuAG, Pr0.2%,Mg5%,Hf5%:LuAG and BGO obtained by measurement of radio-luminescence (X-ray excitation: CuKα). FIG. 23 is a graph showing a profile of emission characteristics of Pr1%:Y$_2$O$_3$ obtained by measurement of radio-luminescence (X-ray excitation: CuKα). FIG. 24 is a graph showing a profile of emission characteristics of Pr1%:YAP obtained by measurement of radio-luminescence (X-ray excitation: CuKα). FIG. 25 is a graph showing a profile of emission characteristics of Pr1%:YVO$_4$ obtained by measurement of radio-luminescence (X-ray excitation: CuKα). FIG. 26 is a graph showing a profile of emission characteristics of Pr0.2%: LaLuO$_3$ obtained by measurement of radio-luminescence (X-ray excitation: CuKα). FIG. 27 is a graph showing a profile of emission characteristics of Pr0.2%:Lu$_2$Si$_2$O$_7$ obtained by measurement of radio-luminescence (X-ray excitation: CuKα).

Figure 28:
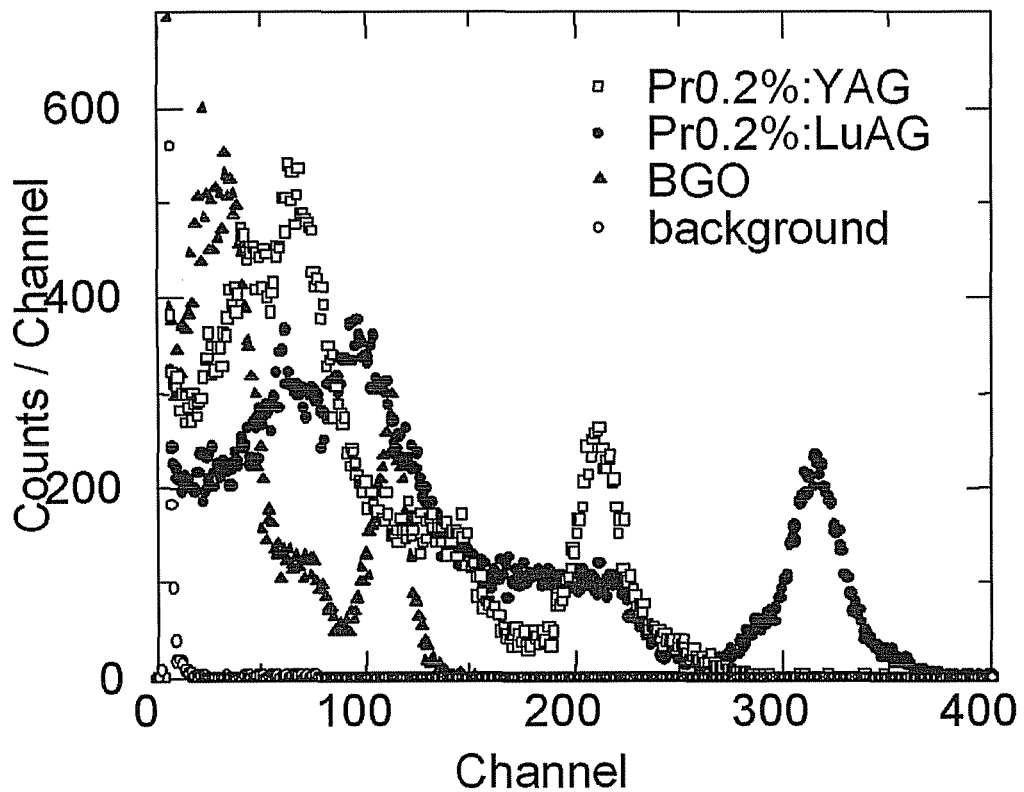
FIG. 28 shows results of emission energy of Pr0.2%: YAG, Pr0.2%:LuAG and BGO excited by γ ray. Emission energy of twice as large as BGO was observed for Pr0.2%: YAG, and three times as large as BGO for Pr0.2%:LuAG.

FIG. 28 shows results of measurement of emission energy of Pr0.2%:YAG, Pr0.2%:LuAG and BGO obtained by γ ray excitation. It is known from FIG. 28 that appearance of peaks on the larger channel side along the X-axis indicates that a large-energy fluorescence is observed, wherein the results of measurement showed energy of emission twice as large as BGO was achieved by Pr0.2%:YAG, and as large as three times achieved by Pr0.2%:LuAG.

Figure 29:
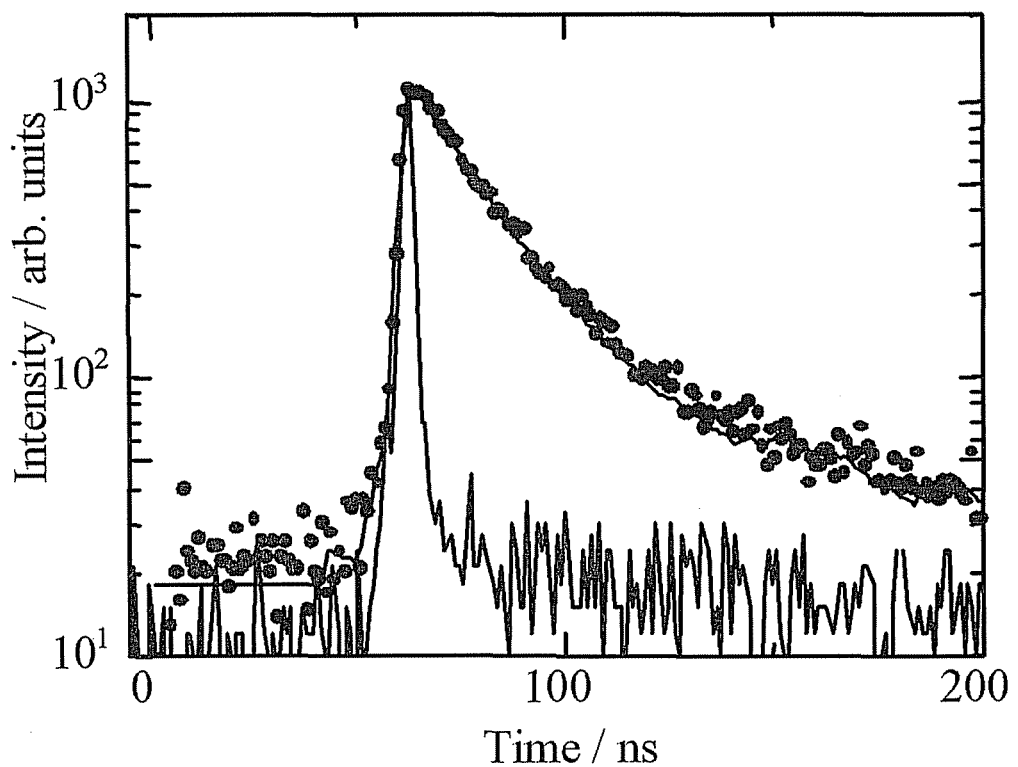
FIG. 29 is a graph showing results of measurement of fluorescence decay time (photo-luminescence decay) of Pr0.2%, Sc1%:YAG. Data expressing a fluorescence lifetime of as short as 12.6 nsec was obtained.
Figure 30:
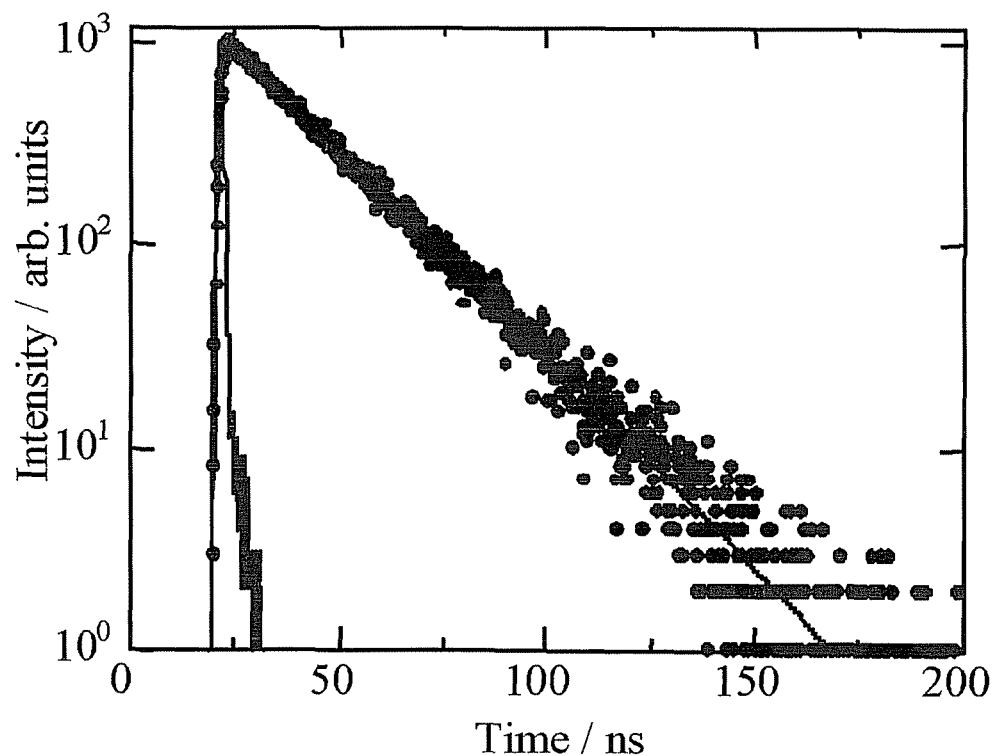
FIG. 30 is a graph showing results of measurement of fluorescence decay time (photo-luminescence decay) of Pr0.2%, Sc1%: LUAG. Data expressing a fluorescence lifetime of as short as 21.3 nsec was obtained.
Figure 31:
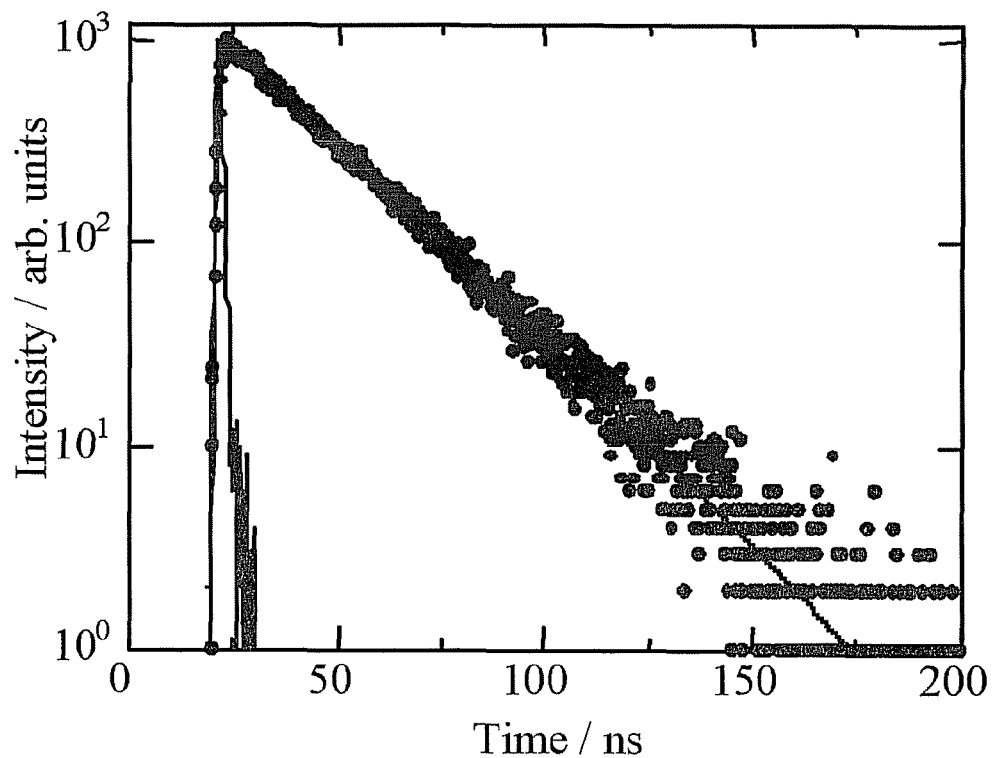
FIG. 31 is a graph showing results of measurement of fluorescence decay time (photo-luminescence decay) of Pr0.2%, Mg5%, Hf5%:LuAG. Data expressing a fluorescence lifetime of as short as 21.7 nsec was obtained.
Figure 32:
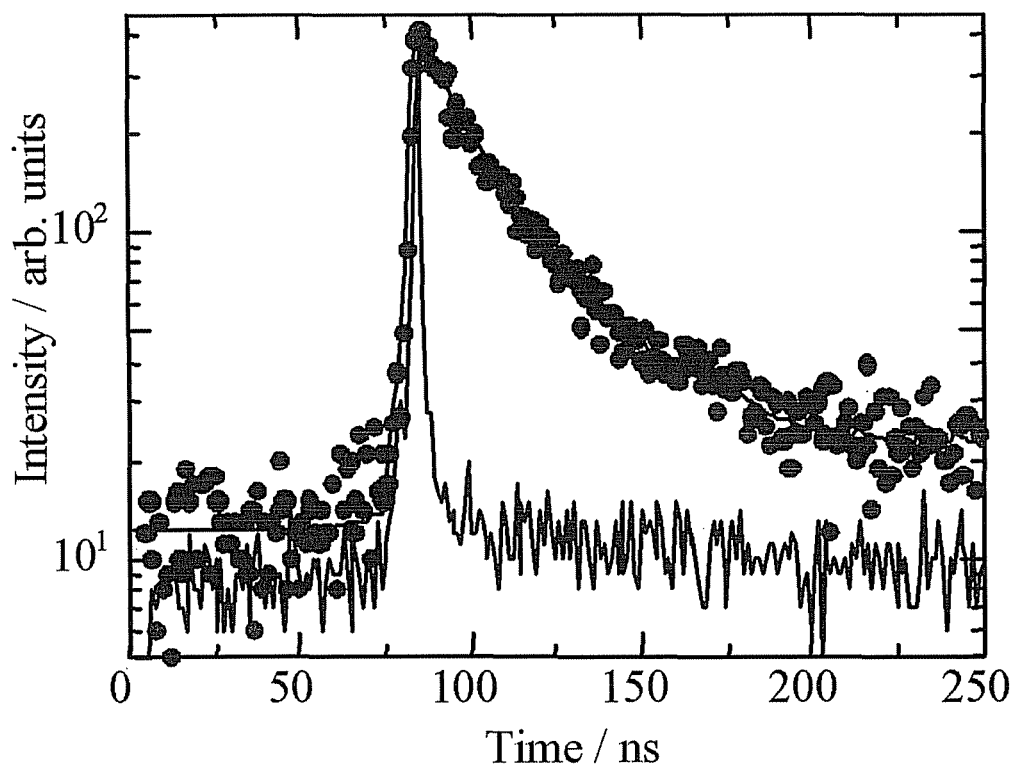
FIG. 32 is a graph showing results of measurement of fluorescence decay time (photo-luminescence decay) of Pr1% (as charged):$Y_2O_3$G. Data expressing a fluorescence lifetime of as short as 21.5 nsec was obtained.
Figure 33:
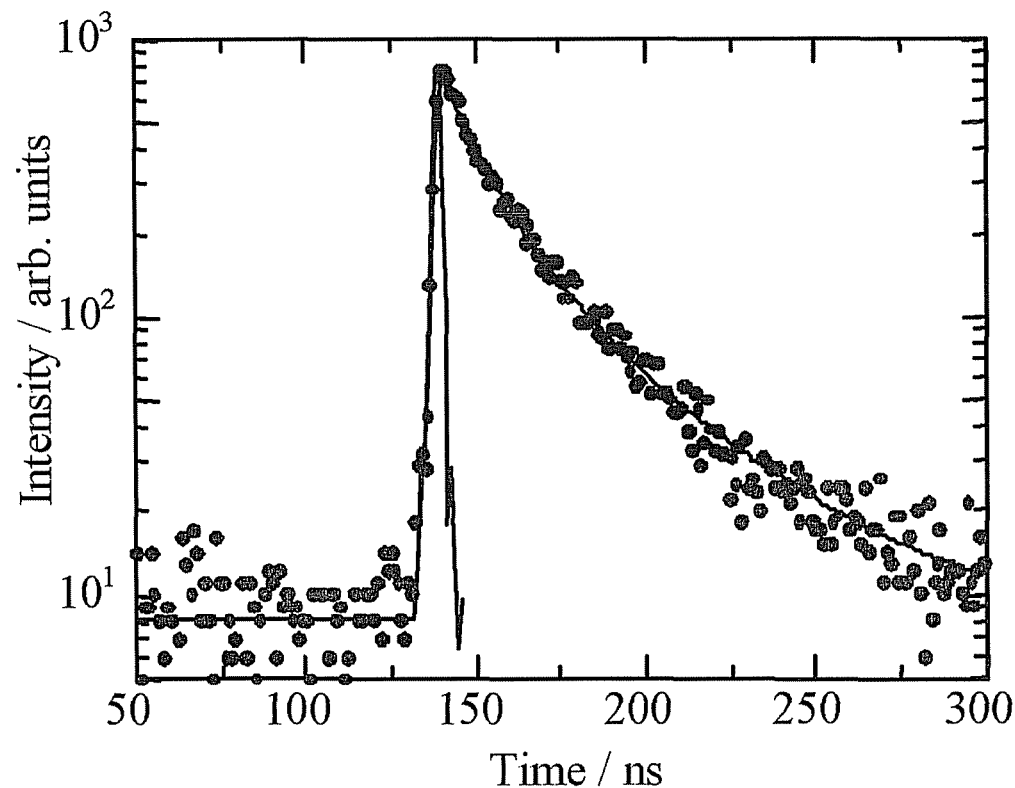
FIG. 33 is a graph showing results of measurement of fluorescence decay time (photo-luminescence decay) of Pr1% (as charged):YAP. Data expressing a fluorescence lifetime of as short as 11.2 nsec was obtained.
Figure 34:
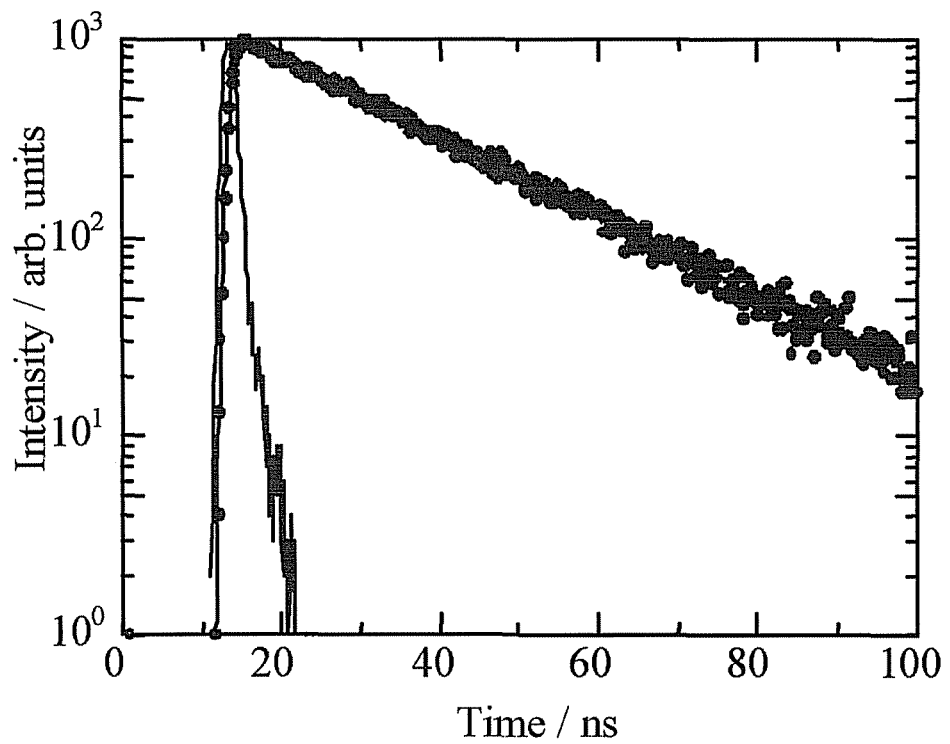
FIG. 34 is a graph showing results of measurement of fluorescence decay time (photo-luminescence decay) of Pr1% (as charged): $YVO_4$. Data expressing a fluorescence lifetime of as short as 22.0 nsec was obtained.
Figure 35:
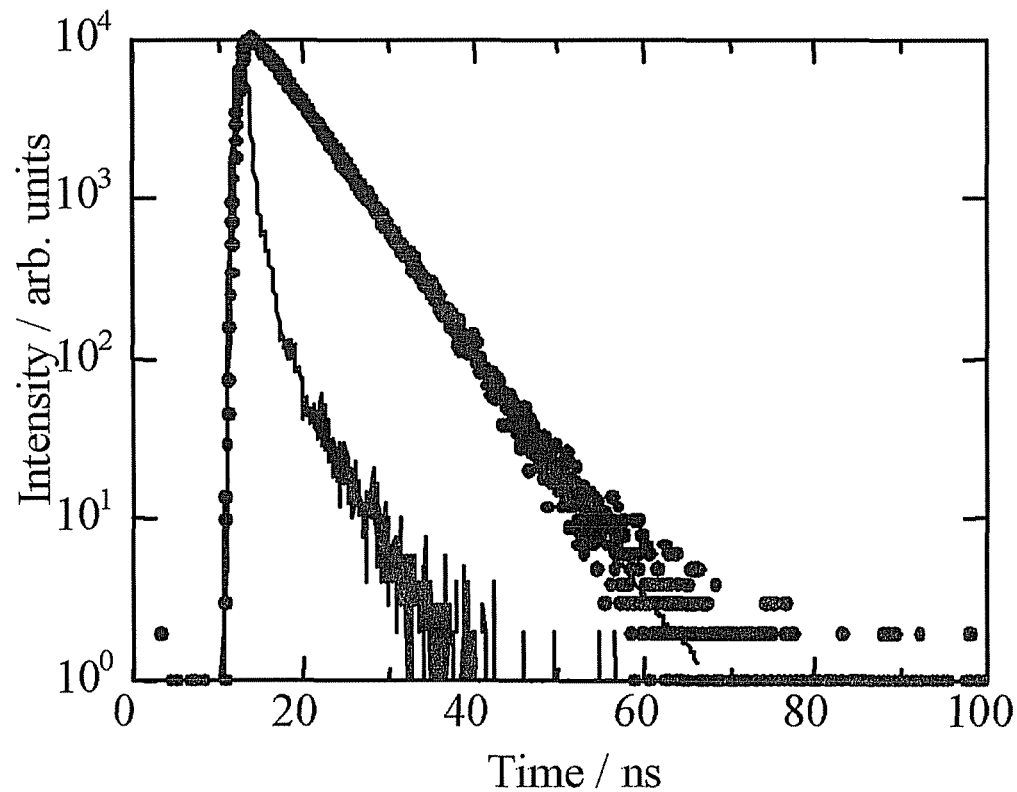
FIG. 35 is a graph showing results of measurement of fluorescence decay time (photo-luminescence decay) of Pr0.2%:$LaLuO_3$. Data expressing a fluorescence lifetime of as short as 6.7 nsec was obtained.
Figure 36:
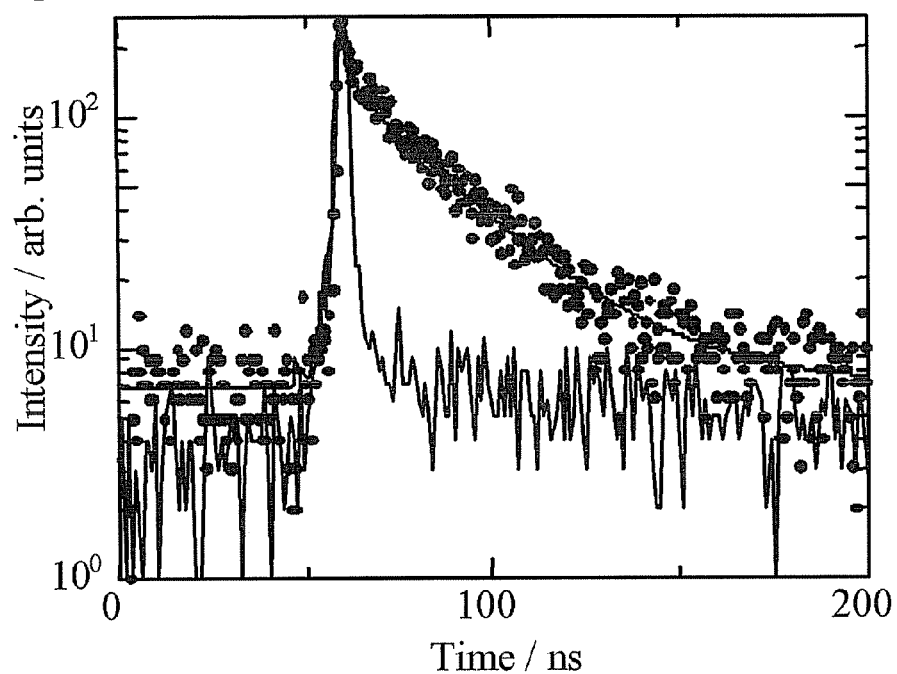
FIG. 36 is a graph showing results of measurement of fluorescence decay time (photo-luminescence decay) of Pr0.2%:$Lu_2Si_2O_7$. Data expressing a fluorescence lifetime of as short as 26.1 nsec was obtained.

FIG. 29 is a graph showing a profile of result of measurement of fluorescence decay time (photo-luminescence decay) of Pr0.2%,Sc1%:YAG. Data indicating a fluorescence lifetime as short as 12.6 ns was obtained. FIG. 30 is a graph showing a profile of result of measurement of fluorescence decay time (photo-luminescence decay) of Pr0.2%,Sc1%:LuAG. Data indicating a fluorescence lifetime as short as 21.3 ns was obtained. FIG. 31 is a graph showing a profile of result of measurement of fluorescence decay time (photo-luminescence decay) of Pr0.2%,Mg5%, Hf5%:LuAG. Data indicating a fluorescence lifetime as short as 21.7 ns was obtained. FIG. 32 is a graph showing a profile of result of measurement of fluorescence decay time (photo-luminescence decay) of Pr1%-as-charged: Y$_2$O$_3$. Data indicating a fluorescence lifetime as short as 21.5 ns was obtained. FIG. 33 is a graph showing a profile of result of measurement of fluorescence decay time (photo-luminescence decay) of Pr1%-as-charged:YAP. Data indicating a fluorescence lifetime as short as 11.2 ns was obtained. FIG. 34 is a graph showing a profile of result of measurement of fluorescence decay time (photo-luminescence decay) of Pr1%-as-charged:LuVO$_4$. Data indicating a fluorescence lifetime as short as 22.0 ns was obtained. FIG. 35 is a graph showing a profile of result of measurement of fluorescence decay time (photo-luminescence decay) of Pr0.2%:LaLuO$_3$. Data indicating a fluorescence lifetime as short as 6.7 ns was obtained. FIG. 36 is a graph showing a profile of result of measurement of fluorescence decay time (photo-luminescence decay) of Pr0.2%:Lu$_2$Si$_2$O$_7$. Data indicating a fluorescence lifetime as short as 26.1 ns was obtained.

As is obvious from these results, emission of the scintillator single crystals composed of the Pr-containing oxides of the present invention show extremely large values of absolute light yield ratio. It is also found that the fluorescence decay time is shorter than 20 nsec, proving their great excellence as scintillator materials.

It is to be noted that the emission of the scintillator single crystal composed of the Pr-containing oxides include also slow components. However, by virtue of their extremely large absolute light yield ratio, they prevail over BGO, GSO and so forth to a sufficient level only by contribution of the short-lifetime components, for the purpose of PET. It is suggested that, by using also emission ascribable to slow components for applications of non-destructive inspection such as X-ray CT, radioactive ray transmission inspection apparatus and so forth, they can be used as the scintillator single crystals having still larger values of absolute light yield ratio.

Example C1

Figure 37:
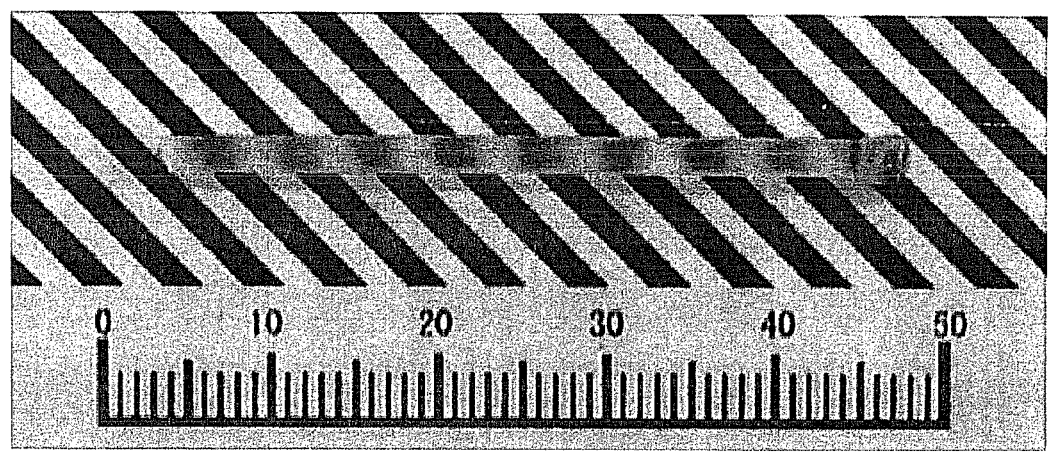
FIG. 37 is an exemplary photograph of a $Pr_wM_xRE_yF_z$ (M=K, RE=Y) crystal prepared by the micro-pulling-down process according to the present invention.

A fluoride scintillator single crystal expressed by a composition of K(PrY)$_3$F$_{10}$ (Pr1%-as-charged:KYF) was manufactured by the micro-pulling-down process. The obtained crystal is shown in FIG. 37. The single crystal was found to be transparent.

Example C2

Figure 38:
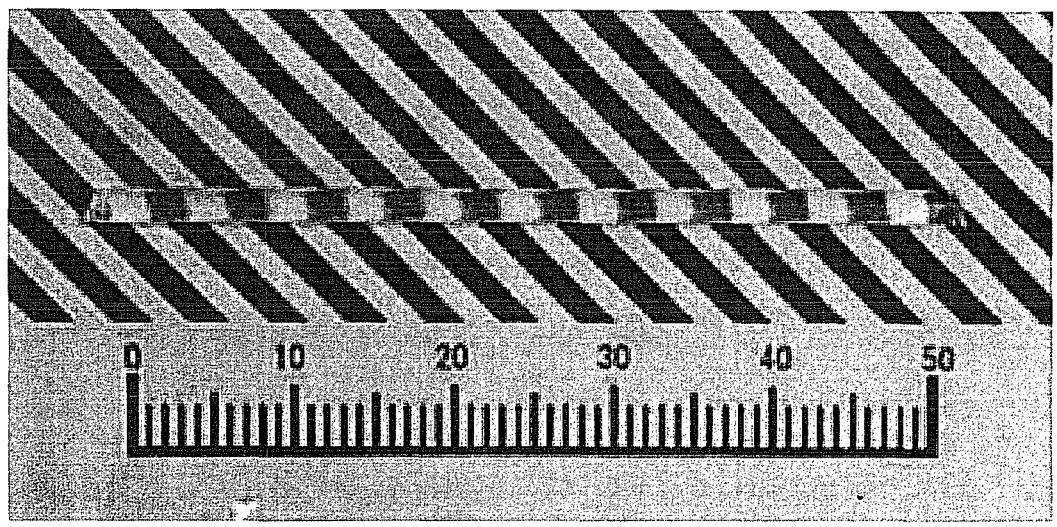
FIG. 38 is an exemplary photograph of a $Pr_wM_xRE_yF_z$ (M=K, RE=Y and Lu) crystal prepared by the micro-pulling-down process according to the present invention.

A fluoride scintillator single crystal expressed by a composition of K(PrYLu)$_3$F$_{10}$ (Pr2%-as-charged:KYLuF) was manufactured by the micro-pulling-down process. The obtained crystal is shown in FIG. 38. The single crystal was found to be transparent.

Figure 39:
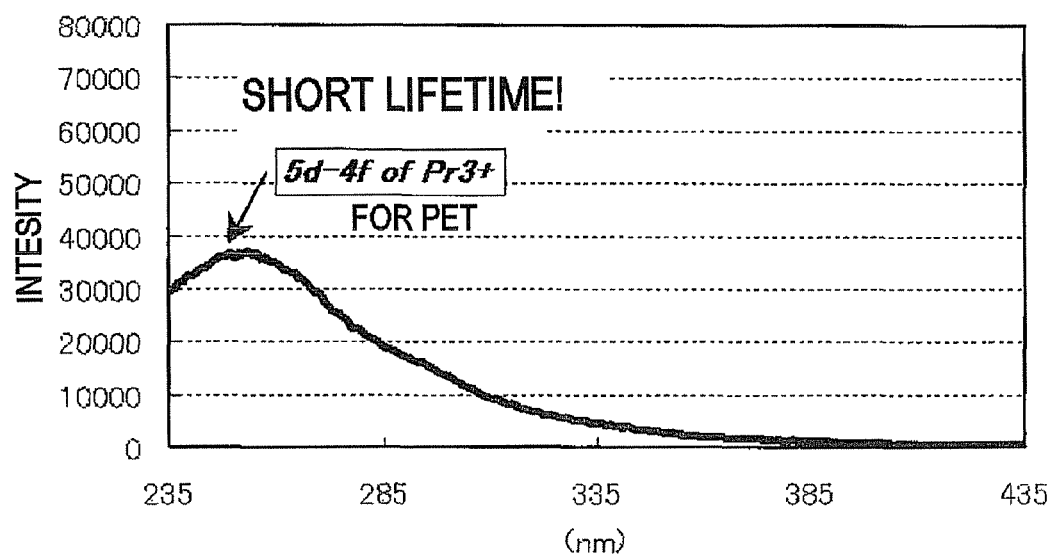
FIG. 39 is a graph showing a profile of results of light emission characteristics of $K(PrY)_3F_{10}$ (Pr1%-as-charged: KYF) measured by radio-luminescence. Comparison with FIG. 40 showed that the peak top indicates an emission energy 3.5 times as large as that of BGO.
Figure 40:
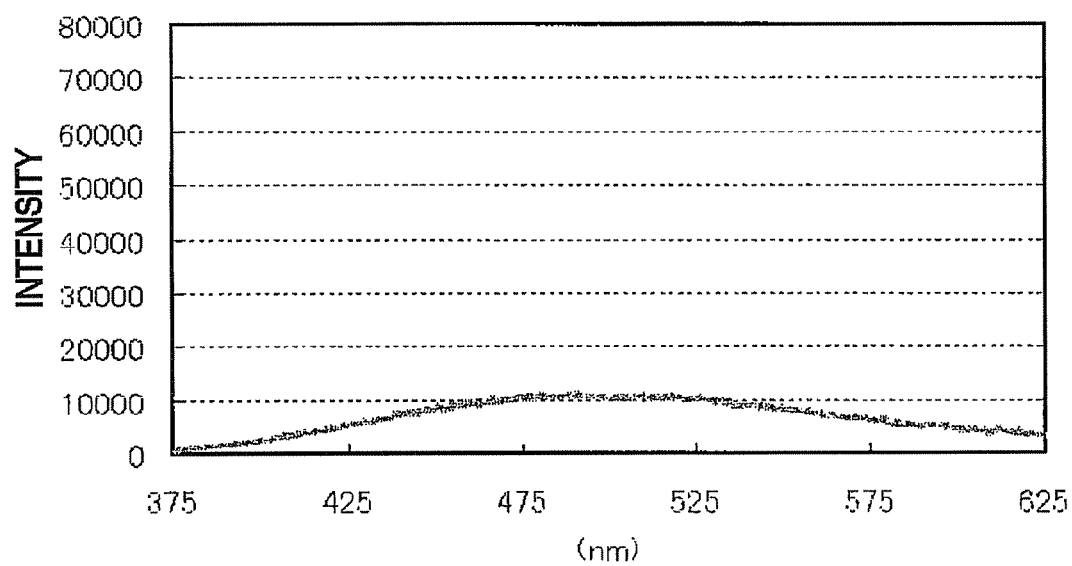
FIG. 40 is a graph showing a profile of results of light emission characteristics of BGO measured by radio-luminescence.
Figure 41:
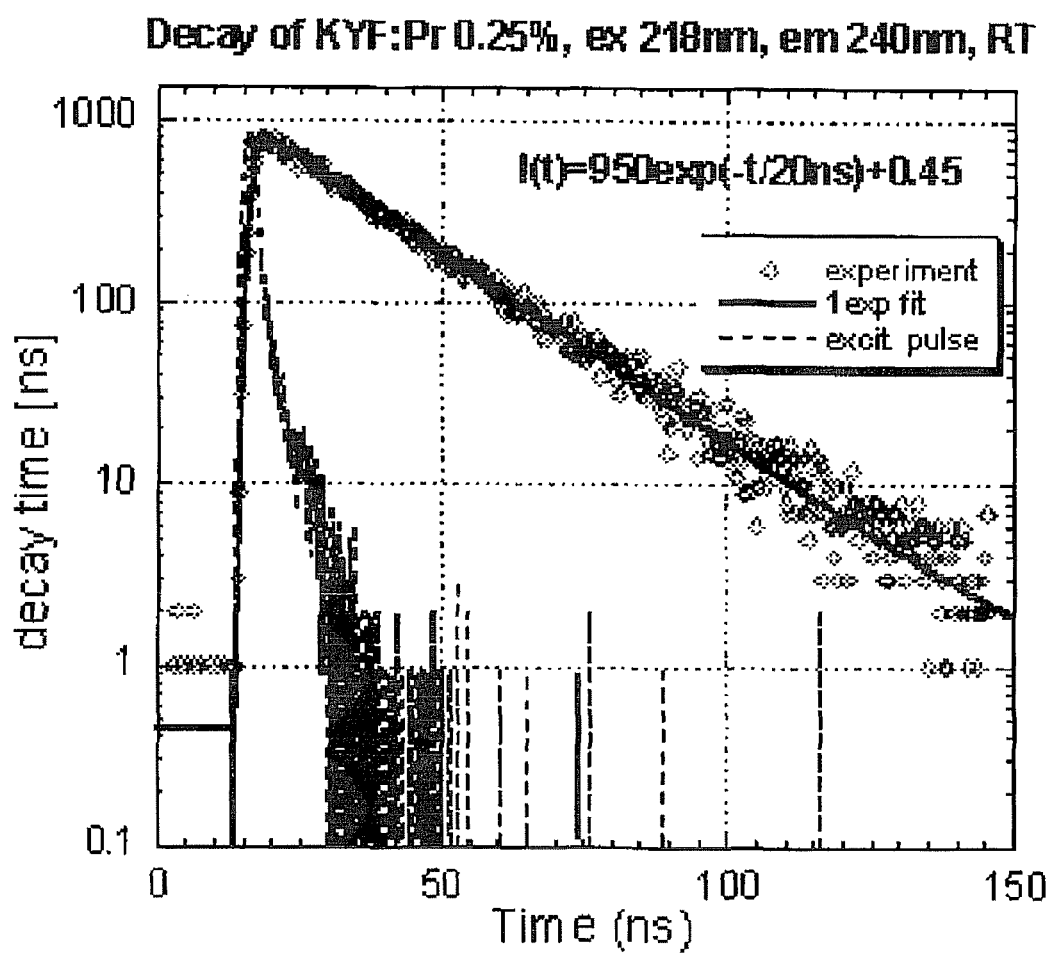
FIG. 41 is a graph showing a profile of results of fluorescence decay time of a $K(PrY)_3F_{10}$ (Pr1%-as-charged: KYF) crystal at 240 nm measured by photo-luminescence. Data expressing a fluorescence lifetime of as short as 20 nsec was obtained.

FIG. 39 is a graph showing a profile of emission characteristics of Pr1%-as-charged:KYF obtained by measurement of radio-luminescence, and FIG. 40 is a graph showing a profile of emission characteristics of BGO obtained by measurement of radio-luminescence. FIG. 41 is a graph showing a profile of fluorescence decay time of Pr1%-as-charged: KYF obtained by measurement of photo-luminescence from 218 nm excitation→240 nm.

It was found that γ-ray-induced emission of Pr2%-as-charged:KYLuF single crystal was twice as large as that of Pr1%-as-charged:KYF single crystal, indicating that doping of Lu resulted in an extremely large absolute light yield ratio. On the other hand, the fluorescence lifetime was remained at an equivalent level.

As can be seen from these results, emission of the scintillator single crystals composed of the Pr-containing oxides of the present invention show extremely large values of absolute light yield ratio. It is also found that the fluorescence decay time is shorter than 20 nsec, proving their great excellence as scintillator materials.

Comparative Example

Figure 42:
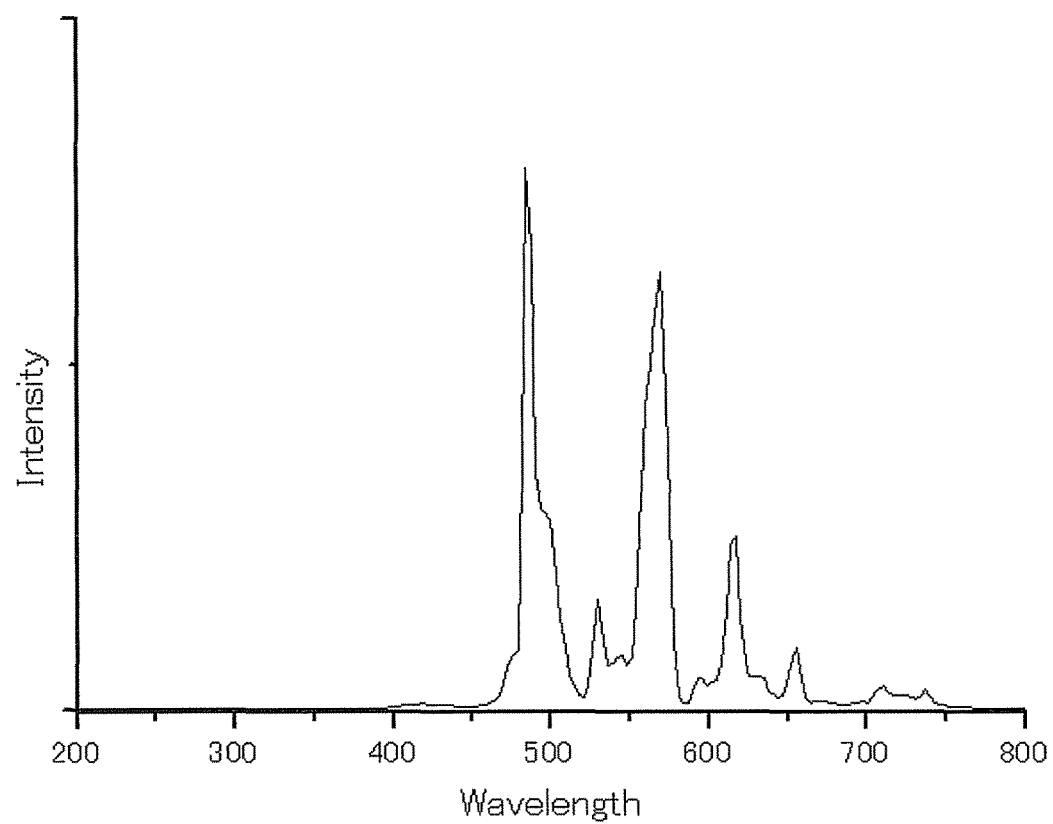
FIG. 42 is a graph showing a profile of light emission of single crystal of a conventional gadolinium gallium garnet-type oxide.

A garnet-type oxide scintillator single crystal expressed by a composition of (PrGd)$_3$Ga$_5$O$_{12}$ (Pr1%-as-charged: GGG) described in Patent Document 1, which has conventionally been used as a scintillator single crystal, was prepared, and emission characteristics under excitation by 285- nm ultraviolet radiation were measured. FIG. 42 is a graph showing a profile of the emission characteristics.

It is known from FIG. 42 that the conventional single crystal composed of gadolinium-gallium-garnet (GGG)-type oxide showed no, or only an extremely low level of light emission ascribable to fluorescence in the ultraviolet region. More specifically, it is supposed that the GGG-type oxide single crystal does not show any peaks ascribable to f-f transition of Gd and ascribable to 5d-4f transition of $Pr^{3+}$. It is therefore suggested that the GGG-type oxide single crystal is difficult to achieve energy of emission required for rapid-response radioactive ray detection.

The invention claimed is:

1. A scintillator single crystal expressed by $(Pr_xLu_{1-x})_3Al_5O_{12}$ where $0.002 \leq x \leq 0.02$; and
the scintillator single crystal emits fluorescence having a wavelength of 200 to 350 nm when excited by gamma ray and having a decay time at room temperature of 1 to 50 nsec, and
wherein the scintillator single crystal is a crystal formed by Czochralski method.

2. The scintillator single crystal according to claim 1, wherein the scintillator single crystal has an emission peak at a wavelength of 200 to 350 nm.

3. The scintillator single crystal according to claim 1, wherein the scintillator single crystal has an emission peak at a wavelength of about 300 nm.

4. The scintillator single crystal according to claim 1, wherein a fluorescence decay time of the scintillator single crystal is shorter than 20 nsec.

5. The scintillator single crystal according to claim 1, wherein the scintillator single crystal is expressed by $(Pr_xLu_{1-x})_3Al_5O_{12}$ where $0.002 \leq x \leq 0.003$.

6. A method of manufacturing the scintillator single crystal of claim 1, comprising charging Pr into a molten liquid expressed by $(Pr_xLu_{1-x})_3Al_5O_{12}$ where $0.002 \leq x \leq 0.02$, to an amount 5 to 15 times as much as a target amount of incorporation of Pr, and allowing said single crystal to grow by the micro-pulling-down process, using a molybdenum (Mo) crucible, or an iridium (Ir) crucible, or a crucible composed of an alloy of Ir and rhenium (Re).

7. A radiation detector having a scintillator composed of the scintillator single crystal according to claim 1, and configured as having a radiation detection unit detecting radioactive ray, and as being combined therewith a light receiving unit receiving fluorescence output as a result of detection of radioactive ray by said radiation detection unit.

8. A radiation inspection apparatus comprising the radiation detector according to claim 7.

9. The radiation inspection apparatus according to claim 8, being a positron emission tomography (PET) apparatus adoptable to a medical image processing apparatus.

10. The radiation inspection apparatus adoptable to a medical image processing apparatus according to claim 9, wherein said PET is two-dimensional PET, three-dimensional PET, time-of-flight-type (TOF-type) PET, depth-of-interaction-type (DOI-type) PET, or combinations thereof.

11. The radiation inspection apparatus according to claim 10, wherein said radiation inspection apparatus adoptable to said medical image processing apparatus is any one of stand-alone apparatus, magnetic resonance imaging apparatus (MRI), computed tomography apparatus (CT) and single photon computed tomography (SPECT), or combination thereof.

12. A radiation inspection apparatus adoptable to non-destructive inspection having the radiation detector according to claim 7, being either one of X-ray computed tomography apparatus (CT) and radiographic apparatus for radioactive ray transmission inspection, or combination thereof.

* * * * *